United States Patent
Crum et al.

(10) Patent No.: US 11,495,672 B2
(45) Date of Patent: Nov. 8, 2022

(54) INCREASED TRANSISTOR SOURCE/DRAIN CONTACT AREA USING SACRIFICIAL SOURCE/DRAIN LAYER

(71) Applicant: INTEL CORPORATION, Santa Clara, CA (US)

(72) Inventors: Dax M. Crum, Beaverton, OR (US); Biswajeet Guha, Hillsboro, OR (US); William Hsu, Hillsboro, OR (US); Stephen M. Cea, Hillsboro, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 945 days.

(21) Appl. No.: 16/023,024

(22) Filed: Jun. 29, 2018

(65) Prior Publication Data
US 2020/0006525 A1 Jan. 2, 2020

(51) Int. Cl.
*H01L 29/66* (2006.01)
*H01L 21/02* (2006.01)
(Continued)

(52) U.S. Cl.
CPC .. *H01L 29/66545* (2013.01); *H01L 21/02603* (2013.01); *H01L 21/823418* (2013.01);
(Continued)

(58) Field of Classification Search
None
See application file for complete search history.

(56) References Cited

U.S. PATENT DOCUMENTS

| 9,601,379 B1 | 3/2017 | Pawlak et al. |
| 9,847,390 B1 | 12/2017 | Xie et al. |
(Continued)

FOREIGN PATENT DOCUMENTS

WO 2018009162 1/2018

OTHER PUBLICATIONS

European Search Report dated Nov. 28, 2019 for EP Patent Application No. 19176633.3, 6 pages.
(Continued)

*Primary Examiner* — Joseph C. Nicely
*Assistant Examiner* — Lamont B Koo
(74) *Attorney, Agent, or Firm* — Schwabe Williamson & Wyatt, P.C.

(57) ABSTRACT

Integrated circuit structures including increased transistor source/drain (S/D) contact area using a sacrificial S/D layer are provided herein. The sacrificial layer, which includes different material from the S/D material, is deposited into the S/D trenches prior to the epitaxial growth of that S/D material, such that the sacrificial layer acts as a space-holder below the S/D material. During S/D contact processing, the sacrificial layer can be selectively etched relative to the S/D material to at least partially remove it, leaving space below the S/D material for the contact metal to fill. In some cases, the contact metal is also between portions of the S/D material. In some cases, the contact metal wraps around the epi S/D, such as when dielectric wall structures on either side of the S/D region are employed. By increasing the S/D contact area, the contact resistance is reduced, thereby improving the performance of the transistor device.

19 Claims, 12 Drawing Sheets

(51) Int. Cl.
  *H01L 21/8234* (2006.01)
  *H01L 21/8238* (2006.01)
  *H01L 27/092* (2006.01)
  *H01L 29/423* (2006.01)
  *H01L 29/78* (2006.01)

(52) U.S. Cl.
  CPC .. *H01L 21/823821* (2013.01); *H01L 27/0924* (2013.01); *H01L 29/42392* (2013.01); *H01L 29/66795* (2013.01); *H01L 29/785* (2013.01); *H01L 2029/7858* (2013.01)

(56) References Cited

U.S. PATENT DOCUMENTS

| | | | |
|---|---|---|---|
| 2014/0001520 A1* | 1/2014 | Glass | H01L 29/66795 257/288 |
| 2015/0295089 A1 | 10/2015 | Huang et al. | |
| 2016/0343734 A1 | 11/2016 | Doris et al. | |
| 2017/0012129 A1 | 1/2017 | Basker et al. | |
| 2017/0018464 A1 | 1/2017 | Kim et al. | |
| 2017/0133377 A1* | 5/2017 | Glass | H01L 21/823821 |
| 2019/0326395 A1* | 10/2019 | Ando | H01L 29/0673 |

OTHER PUBLICATIONS

Office Action from European Patent Application No. 19176633.3 dated Dec. 9, 2021, 4 pages.

* cited by examiner

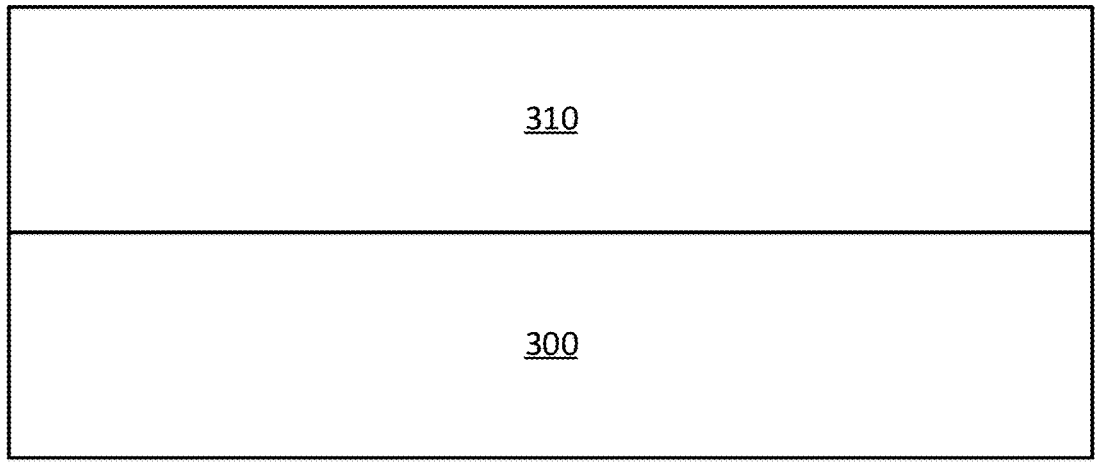
FIG. 3A
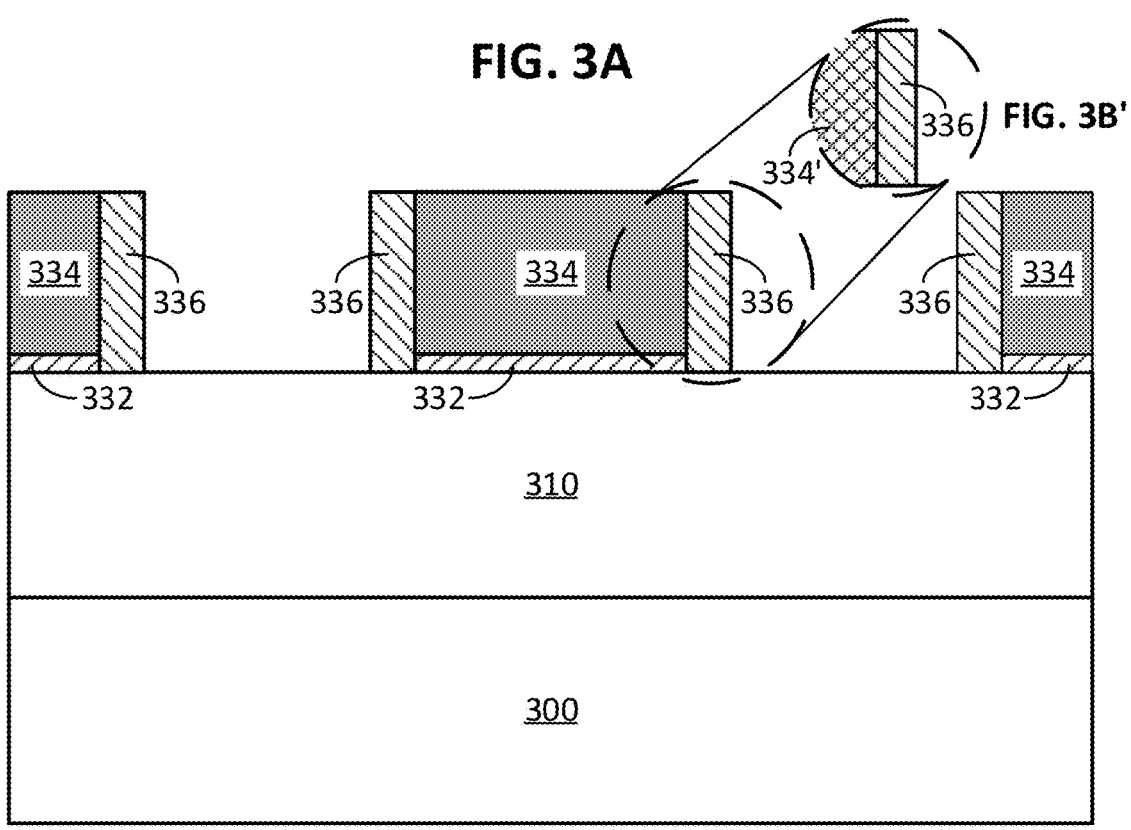
FIG. 3B
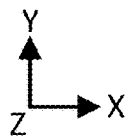

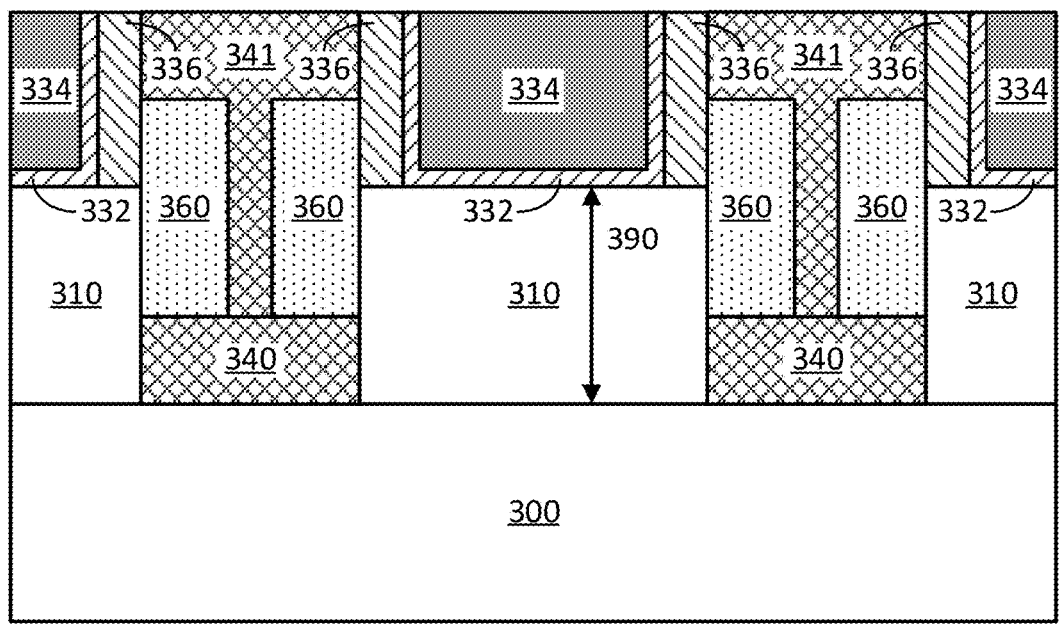
FIG. 3F'
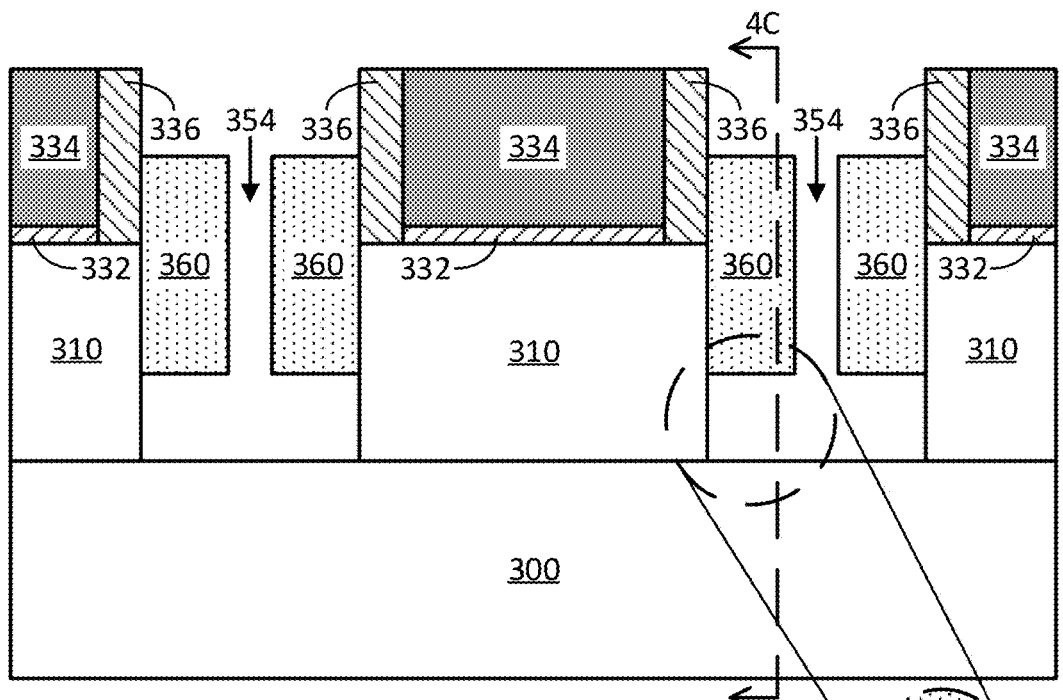
FIG. 3G
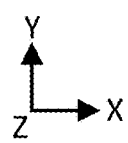
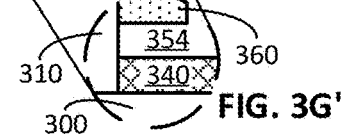

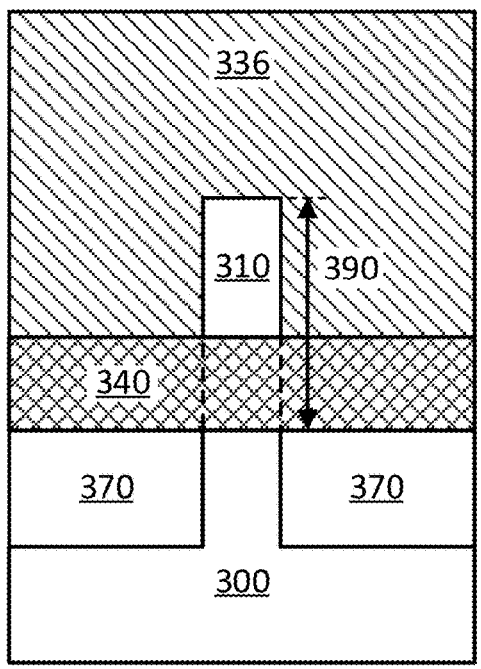
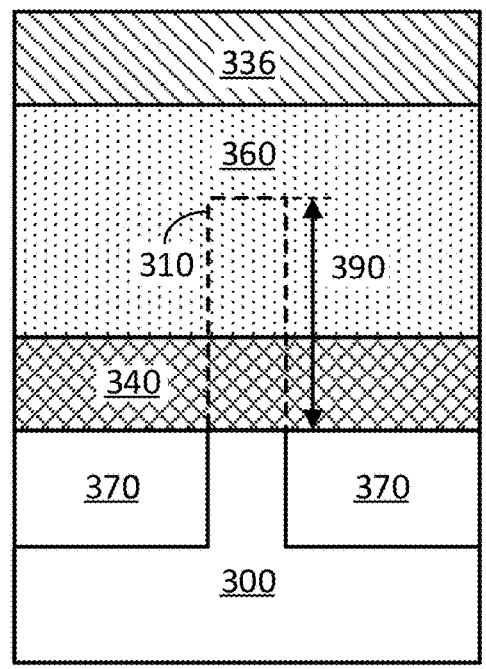
FIG. 4A
FIG. 4B
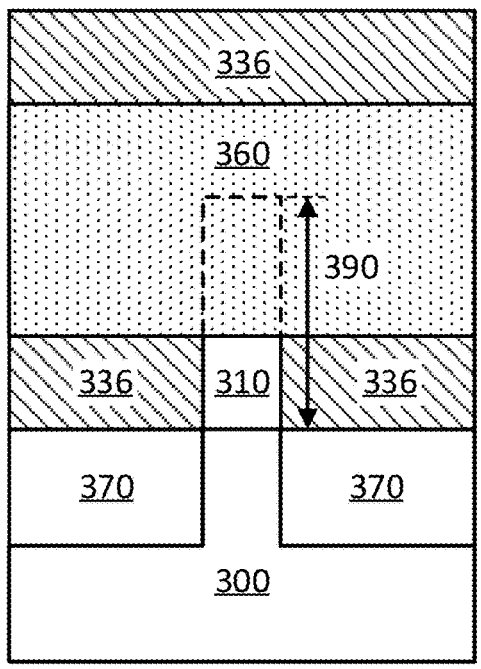
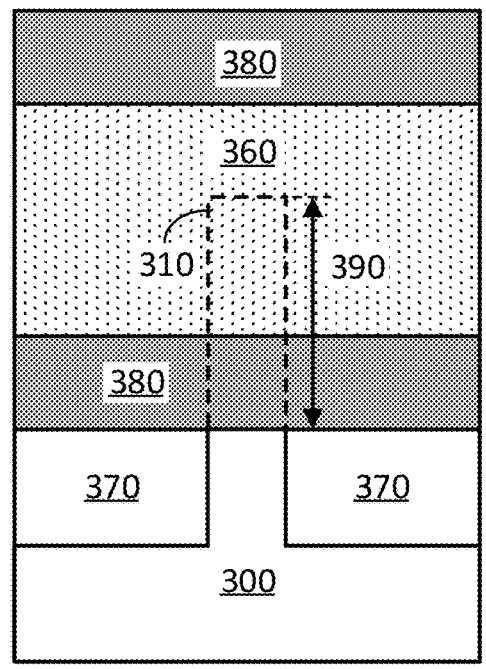
FIG. 4C
FIG. 4D
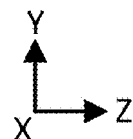

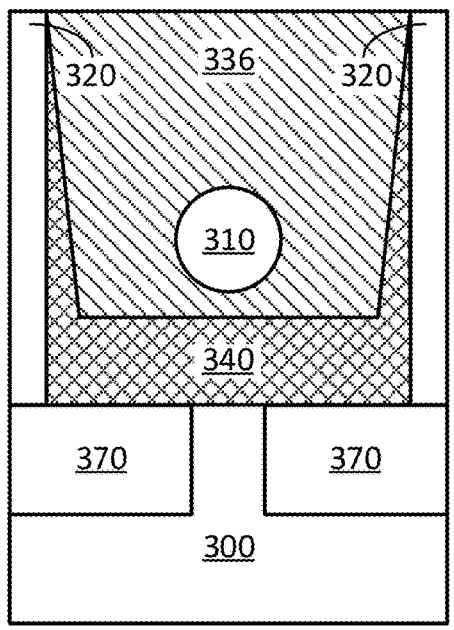 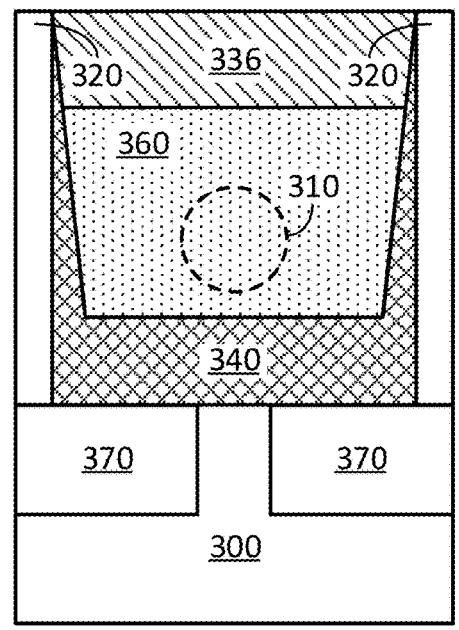
FIG. 7A　　　　　　　　FIG. 7B
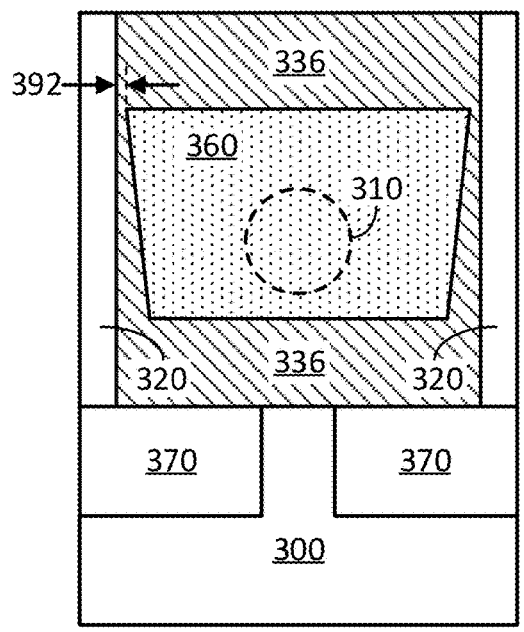 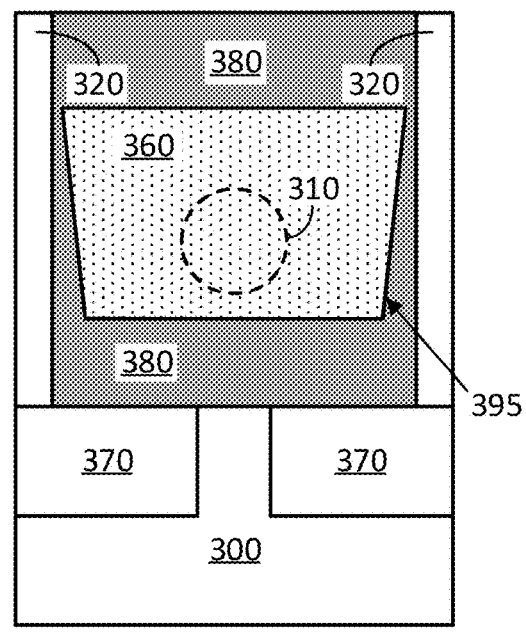
FIG. 7C　　　　　　　　FIG. 7D

INCREASED TRANSISTOR SOURCE/DRAIN CONTACT AREA USING SACRIFICIAL SOURCE/DRAIN LAYER

BACKGROUND

Semiconductor devices are electronic components that exploit the electronic properties of semiconductor materials, such as silicon (Si), germanium (Ge), and gallium arsenide (GaAs). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel or n-type device, and in instances where the charge carriers are holes, the FET is referred to as a p-channel or p-type device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer regions of the fin (e.g., top and two sides), such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A gate-all-around (GAA) transistor, where the channel region includes, for example, one or more nanowires or nanoribbons, is configured similarly to a fin-based transistor, but instead of a finned channel region where the gate is on three portions (and thus, there are three effective gates), the gate material generally surrounds each nanowire or nanoribbon.

BRIEF DESCRIPTION OF THE DRAWINGS

FIGS. 3A-3H illustrate cross-sectional views of example IC structures formed when carrying out the method of FIG. 2 using a gate-first process flow, in accordance with some embodiments. FIGS. 3B', 3F', and 3H' illustrate variations to corresponding example structures of FIGS. 3B, 3F, and 3H, respectively, that occur when carrying out the method of FIG. 2 using a gate-last process flow, in accordance with some embodiments. The cross-sectional views in FIGS. 3A-3H (as well as FIGS. 5 and 6) are along the body of channel material and perpendicular to the gate line to help illustrate the structures formed.

FIGS. 4A-4D illustrate example cross-sectional views of a plane taken through a source/drain region of the structures of FIGS. 3D, 3E, 3G, and 3H, respectively, to help show the processing described herein, in accordance with some embodiments.

FIGS. 7A-7D illustrate example cross-sectional integrated circuit views through a source/drain region of the structure of FIG. 6 to illustrate forming the source/drain contact structure around that source/drain region when employing dielectric wall structures, in accordance with some embodiments.

FIG. 8A is an example planar view taken along dashed line 8A-8A in the example structures of FIGS. 3H, 3H', and 5. In addition, FIG. 8B is an example planar view taken along dashed line 8B-8B in the example structure of FIG. 6. FIGS. 8C and 8D illustrate other example channel region configurations.

Figure 1:
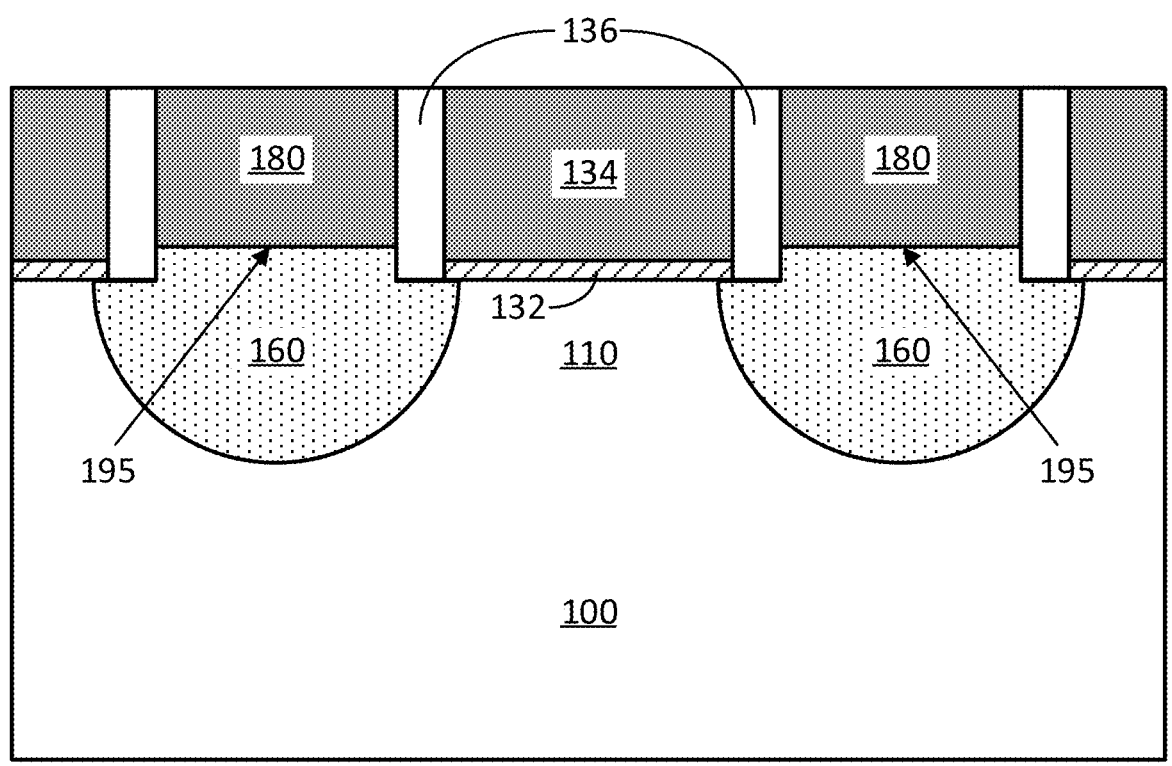
FIG. 1 illustrates a cross-sectional view of an example integrated circuit (IC) structure showing source/drain contacts that are only above the source/drain regions.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying distinct features. In short, the figures are provided merely to show example structures.

DETAILED DESCRIPTION

In transistor devices, such as MOSFET devices, there are numerous sources of undesired resistance. One such source of undesired resistance is from the contact resistance that is present between the source/drain (S/D) semiconductor material and corresponding contact metal structures (which are referred to as S/D contacts). S/D contact resistance, which is parasitic, is an important limiting factor in drive currents, performance, and circuit delay for modern transistor technologies (such as CMOS technologies). There are two main aspects of S/D contact resistance—electrical resistance at the interface between S/D metal and S/D semiconductor; and contact area, which is the total surface area of the contact interface. Electrical resistance across the S/D metal/semiconductor interface is related to material properties and is not discussed further in this disclosure. For a given electrical resistance across the interface, however, the total contact resistance can be lowered by increasing the total contact area. Typical device designs allow for the metal to only contact the S/D from the top, in so-called top-interface contacts. For instance, FIG. 1 illustrates a cross-sectional view of an example integrated circuit (IC) structure showing S/D contacts that are only above the S/D regions (top-interface contacts). In more detail, the IC structure of FIG. 1 includes substrate 100 (such as a silicon substrate), channel region 110, gate dielectric 132, gate electrode 134, gate sidewall spacers 136, S/D regions 160, S/D contacts 180, and contact interfaces 195, which lie between 160 and 180 regions. As shown, corresponding S/D contacts 180 are only above S/D regions 160, which only provides a small contact area—the area at the interface 195 between the top surface of a S/D region 160 and its corresponding contact 180. Such a small contact area results in undesirably high S/D contact resistance. Moreover, the contact resistance goes up in scaled transistors due to reduced contact area between the metal contacts and the semiconductor material included in the S/D regions.

Thus, and in accordance with various embodiments of the present disclosure, transistors with increased S/D contact area achieved using a sacrificial S/D layer are provided herein. The purpose of this disclosure is to describe an integrated process enabled by a sacrificial S/D layer resulting in increased contact area of embodiments herein relative to traditional top-interface contacts. In some embodiments, the sacrificial layer is deposited prior to the epitaxial growth of the S/D material, such that the sacrificial layer is below that epitaxial S/D material (also referred to herein as "epi"). During the S/D contact processing, the sacrificial layer can then be etched away to expose the underside of the S/D material, such that the S/D contact metal can be deposited under (and in some cases, in-between) the epitaxial S/D material. In addition, the sacrificial S/D layer provides multiple integration advantages. For instance, the sacrificial layer as variously described herein allows reliable etch-biasing and removal at contact, in accordance with some embodiments. Further, the sacrificial layer as variously described herein can act as an etch stop when etching down into the epitaxial S/D material, in accordance with some embodiments. Further still, the sacrificial layer as variously described herein can be employed for non-planar transistors, such as finned transistors (e.g., FinFETs) and gate-all-around or GAA transistors (e.g., that employ one or more nanowires or nanoribbons), in accordance with some embodiments. Thus, the contact area between the metal and epi (semiconductor material) in the S/D regions is increased, thereby reducing the contact resistance at those locations and improving overall device performance.

Note that the use of "source/drain" or "S/D" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

In some embodiments, the sacrificial S/D layer includes dielectric material or semiconductor material that is compositionally different from the S/D semiconductor material. Materials that are "compositionally different" or "compositionally distinct" as used herein refers to two materials that have different chemical compositions. This compositional difference may be, for instance, by virtue of an element that is in one material but not the other (e.g., silicon germanium is compositionally different from silicon and silicon dioxide is compositionally different from silicon), or by way of one material having all the same elements as a second material but at least one of those elements is intentionally provided at a different concentration in one material relative to the other material (e.g., SiGe having 70 atomic percent germanium is compositionally different from SiGe having 25 atomic percent germanium). In addition to such chemical composition diversity, the materials may also have distinct dopants (e.g., boron versus arsenic/phosphorous) or the same dopants but at differing concentrations. In still other embodiments, compositionally different materials may further refer to two materials that have different crystallographic orientations. For instance, (110) Si is compositionally distinct or different from (100) Si.

In some embodiments, the sacrificial layer is deposited after forming the S/D trenches but prior to forming the final S/D material, such that the sacrificial layer is formed at least on the bottom portion of the S/D trenches. In some such embodiments, the S/D trenches are formed via etch processing to remove the channel material layer in the S/D locations, and such etch processing may be referred to as epi-undercut (EUC) processing. After EUC processing and before epi, a sacrificial layer is deposited in the S/D trenches. In some embodiments, the processing proceeds with the epi growth, which is interrupted before epis in neighboring cells merge. In some such embodiments, another sacrificial layer is deposited which encapsulates the epi. In some embodiments, the epi growth processing allows the epis of neighboring cells to merge. In some such embodiments, a deep etch is used to punch through the epi and stop at the sacrificial layer (e.g., during the contact processing) to provide access to that sacrificial layer. Then, at the contact processing, the sacrificial layers are selectively etched with respect to the S/D epi. The S/D contact metal is then deposited (e.g., via ALD and/or CVD), which deposits metal all-around the epi, including the underside of epi and between epis in neighboring cells.

Some embodiments employ dielectric wall structures (which may be referred to as self-aligned gate endcap walls or other tall dielectric isolation structures) at transistor boundaries to provide a tall wall between adjacent fins/nanowires/nanoribbons, for example. After epi-undercut (EUC) processing and before epi S/D material is formed, the sacrificial layer as variously described herein is deposited in the S/D trenches and on the sidewalls of the dielectric wall structures that are in the S/D trenches. The sacrificial layer encapsulates the epi S/D material as it grows, thereby providing isolation between the sidewall of the epi and the dielectric wall structures, and between the underside of the epi and the substrate. At the S/D contact processing, the sacrificial layer is selectively etched with respect to the epi. The S/D contact metal is then deposited (e.g., via ALD and/or CVD), which deposits metal all-around the epi, including the underside of the epi and along the sidewalls of the epi between the dielectric wall structures.

The techniques and structures disclosed herein provide many benefits. For instance, the techniques increase contact area between epi (in the S/D regions) and metal (in the S/D contacts) by allowing contact of the epi on the underside and, in some cases, in-between adjacent epi S/D portions. This increased contact area reduces contact resistance. In addition, by forming the S/D contact structures in such a manner, a better conduction path is achieved for the transistor, as the path from source contact to source to channel to drain to drain contact is a straighter path (and may even be an exact straight line). Comparing this to the S/D contacts only being above the S/D regions (such as is shown in FIG. 1), which include the carriers going around a corner as they move from the metal contact to the source-channel-drain path, it can be understood based on this disclosure that having the S/D contacts in-line with the transport direction provides additional benefits. Numerous other benefits will be apparent in light of this disclosure.

Note that, as used herein, the expression "X includes at least one of A or B" refers to an X that includes, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that includes just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that is included, for example, in just A only, in just B only, or in both A and B. The above discussion with respect to "X includes at least one of A or B" equally applies here, as will be appreciated. Moreover, this is true for any number of items.

Use of the techniques and structures provided herein can be detected using tools such as: electron microscopy including scanning/transmission electron microscopy (SEMI-TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools can indicate an integrated circuit including at least one transistor having increased S/D contact area as variously described herein. For instance, the S/D contact structures are above and below the S/D regions in accordance with some embodiments, as opposed to being just above the S/D regions (such as is shown in FIG. 1). In other words, the presence of contact all-around epi processing achieved through sacrificial S/D layers can be identified by the presence of metal on the underside of epi (and in some cases, between epi S/Ds on adjacent structures) through, for example, high resolution TEM imaging. In some embodiments, the techniques and structures described herein can be detected based on remnants from the sacrificial layer as variously described herein, where such a sacrificial layer would not otherwise be present. The S/D contact structures might chemically consist of metals identified via SIMS, TEM, EDX mapping, and/or atom probe tomography, for example. In some embodiments, the techniques described herein can be detected based on the structures formed therefrom. In addition, in some embodiments, the techniques and structures described herein can be detected based on the benefits derived therefrom. Numerous configurations and variations will be apparent in light of this disclosure.

Architecture and Methodology

Figure 2:
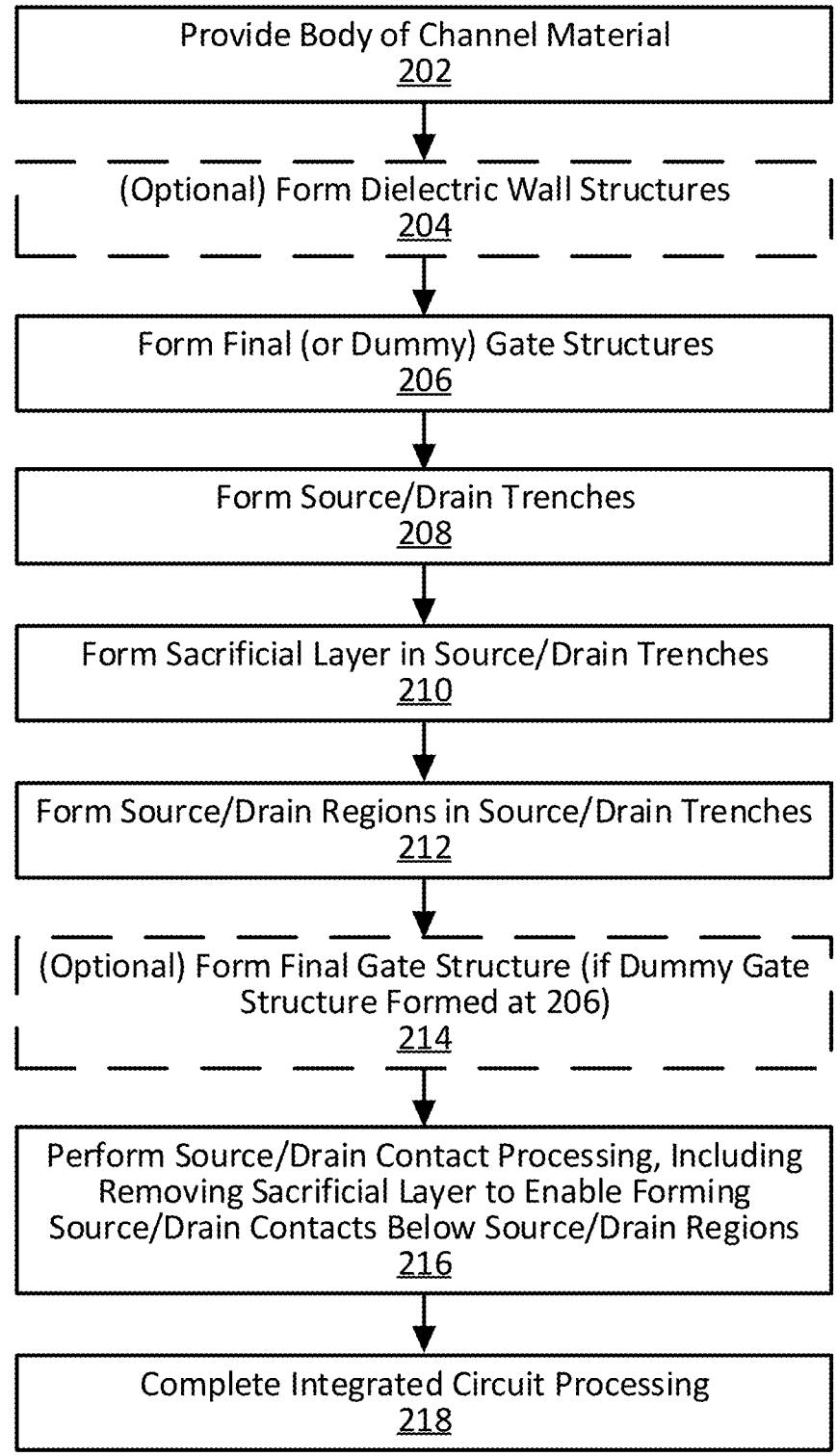
FIG. 2 illustrates example method 200 of forming an integrated circuit (IC) including at least one transistor having increased source/drain contact area by employing a sacrificial source/drain layer, in accordance with some embodiments.
Figure 3C:
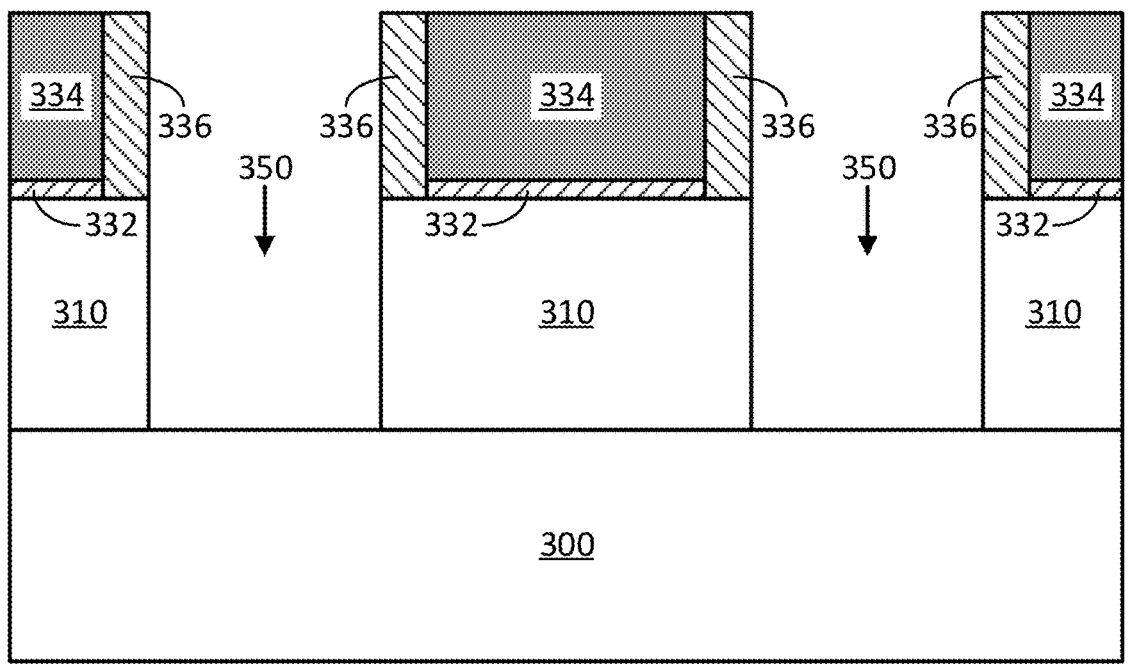

FIG. 2 illustrates example method 200 of forming an integrated circuit (IC) including at least one transistor having increased S/D contact area by employing a sacrificial S/D layer, in accordance with some embodiments. FIGS. 3A-3H illustrate cross-sectional views of example IC structures formed when carrying out method 200 of FIG. 2 using a gate-first process flow, such that the final gate structure is formed at 206 and optional process 214 is not performed, in accordance with some embodiments. FIGS. 3B', 3F', and 3H' illustrate variations to corresponding example structures of FIGS. 3B, 3F, and 3H, respectively, that occur when carrying out method 200 of FIG. 2 using a gate-last process flow, such that a dummy gate structure 334' is formed at 206 and optional process 214 is performed, in accordance with some embodiments. The cross-sectional views in FIGS. 3A-3H (as well as FIGS. 5 and 6) are along the body of channel material and perpendicular to the gate lines to assist with illustrating the processing, including formation and removal of the sacrificial S/D layer that helps increase the transistor S/D contact area.

A multitude of different transistor devices can benefit from the techniques described herein, which includes, but is not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques can be used to benefit an n-channel MOSFET (NMOS) device, which may include a source-channel-drain scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per cubic centimeter (cm), for example), in accordance with some embodiments. In another example, the techniques can be used to benefit a p-channel MOSFET (PMOS) device, which may include a source-channel-drain scheme of p-n-p or p-i-p, in accordance with some embodiments. In yet another example, the techniques can be used to benefit a TFET device, which may include a source-channel-drain scheme of p-i-n or n-i-p, in accordance with some embodiments. In other words, a TFET device may appear the same as a MOSFET device, except that the source and drain regions include opposite type dopant. In still another example, the techniques can be used to benefit a FFFET device, which may include a source-channel-drain scheme of np-i-p (or np-n-p) or pn-i-n (or pn-p-n), in accordance with some embodiments. In other words, such FFFET devices include a bilayer source region configuration where one of the sub-layers of the bilayer includes n-type dopant and the other includes p-type dopant. In general, the techniques disclosed herein to increase contact area using S/D sacrificial layers can benefit any device incorporating S/D contacts.

In addition, in some embodiments, the techniques can be used to benefit transistors including a multitude of configurations, such as planar and/or non-planar configurations, where the non-planar configurations may include finned or FinFET configurations (e.g., dual-gate or tri-gate), gate-all-around (GAA) configurations (e.g., employing one or more nanowires or nanoribbons), or some combination thereof (e.g., a beaded-fin configuration), to provide a few examples. Further, the techniques are used in some embodiments to benefit complementary transistor circuits, such as complementary MOS (CMOS) circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Note that deposition or epitaxial growth techniques (or more generally, additive processing) where described herein can use any suitable techniques, such as chemical vapor deposition (CVD), physical vapor deposition (PVD), atomic layer deposition (ALD), and/or molecular beam epitaxy (MBE), to provide some examples. Also note that etching techniques (or more generally, subtractive processing) where described herein can use any suitable techniques, such as wet and/or dry etch processing which may be isotropic (e.g., uniform etch rate in all directions) or anisotropic (e.g., etch rates that are orientation or directionally dependent), and which may be non-selective (e.g., etches all exposed materials at the same or similar rates) or selective (e.g., etches different materials that are exposed at different rates). Further note that other processing may be used to form the integrated circuit structures described herein, as will be apparent in light of this disclosure, such as hardmasking, patterning or lithography (via suitable lithography techniques, such as, e.g., photolithography, extreme ultraviolet lithography, x-ray lithography, or electron beam lithography), planarizing or polishing (e.g., via chemical-mechanical planarization (CMP) processing), doping (e.g., via ion implantation, diffusion, or including dopant in the base material during formation), and annealing, to name some examples.

In embodiments where semiconductor material described herein includes dopant, the dopant is any suitable n-type and/or p-type dopant that is known to be used for the specific semiconductor material. For instance, in the case of group IV semiconductor materials (e.g., Si, SiGe, Ge), p-type dopant includes group III atoms (e.g., boron, gallium, aluminum), and n-type dopant includes group V atoms (e.g., phosphorous, arsenic, antimony). In the case of group III-V semiconductor materials (e.g., GaAs, InGaAs, InP, GaP), p-type dopant includes group II atoms (e.g., beryllium, zinc, cadmium), and n-type dopant includes group VI atoms (e.g., selenium, tellurium). However, for group III-V semiconductor materials, group VI atoms (e.g., silicon, germanium) can be employed for either p-type or n-type dopant, depending on the conditions (e.g., formation temperatures). In embodiments where dopant is included in semiconductor material, the dopant can be included at quantities in the range of 1E16 to 1E22 atoms per cubic cm, or higher, for example. In some embodiments, dopant is included in semiconductor material in a quantity of at least 1E16, 1E17, 1E18, 5E18, 1E19, 5E19, 1E20, 5E20, or 1E21 atoms per cubic cm and/or of at most 1E22, 5E21, 1E21, 5E20, 1E20, 5E19, 1E19, 5E18, or 1E18 atoms per cubic cm, for example. In some embodiments, semiconductor material described herein is undoped/intrinsic, or includes relatively minimal dopant, such as a dopant concentration of less than 1E16 atoms per cubic cm, for example.

Note that the use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Also note that group III may also be known as the boron group or IUPAC group 13, group IV may also be known as the carbon group or IUPAC group 14, and group V may also be known as the nitrogen group or IUPAC group 15, for example. Further note that semiconductor material described herein has a monocrystalline or single-crystal structure (also referred to as a crystalline structure) unless otherwise explicitly stated (e.g., unless referred to as having a polycrystalline or amorphous structure).

Method 200 of FIG. 2 includes providing 202 a body of channel material, such as providing the example body of channel material 310 shown in FIG. 3A, in accordance with some embodiments. Note that body of channel material 310 may be referred to as simply body 310 herein for ease of description. In some cases, body of channel material 310 may be referred to as a layer or a layer of channel material herein or a channel layer. In some embodiments, body 310 is native to and a part of a substrate used for the integrated circuit, such as substrate 300. Thus, although substrate 300 and body 310 are shown in FIG. 3A as having a distinct interface, that need not be the case in embodiments where body 310 is native to substrate 300. In other embodiments, body 310 includes compositionally different material formed above and/or directly on the integrated circuit substrate 300. Thus, in some such embodiments, a distinct interface, such as is shown in FIG. 3A, can be detected.

Substrate 300, in some embodiments, is: a bulk substrate including group IV semiconductor material, such as silicon (Si), germanium (Ge), silicon germanium (SiGe), or silicon carbide (SiC), group III-V semiconductor material, and/or any other suitable material as can be understood based on this disclosure; an X on insulator (XOI) structure where X is one of the aforementioned semiconductor materials and the insulator material is an oxide material or dielectric material, such that the XOI structure includes the electrically insulating material layer between two semiconductor layers; or some other suitable multilayer structure where the top layer includes semiconductor material to be used for body 310. In some embodiments, the substrate can be an insulator or dielectric substrate, such as a glass substrate. In some such embodiments, the semiconductor material for body 310 can be transferred to that insulator or dielectric substrate to achieve a desired quality (e.g., monocrystalline quality). In some embodiments, substrate 300 is a bulk silicon substrate (that either does or does not include dopant), which may be utilized based on the relatively low cost and availability of such bulk silicon substrates.

In some embodiments, substrate 300 includes a surface crystalline orientation described by a Miller index of (100), (110), or (111), or its equivalents. Although substrate 300 is shown in the figures as having a thickness (dimension in the Y-axis direction) similar to other layers for ease of illustration, in some instances, substrate 300 may be relatively much thicker than the other layers, such as having a thickness in the range of 1 to 950 microns (or in the sub-range of 20 to 800 microns), for example, or any other suitable thickness value or range as can be understood based on this disclosure. In some embodiments, substrate 300 includes a multilayer structure including two or more distinct layers (that may or may not be compositionally different). In some embodiments, substrate 300 includes grading (e.g., increasing and/or decreasing) of one or more material concentrations throughout at least a portion of the substrate 300. In some embodiments, substrate 300 is used for one or more other IC devices, such as various diodes (e.g., light-emitting diodes (LEDs) or laser diodes), various transistors (e.g., MOSFETs, TFETs), various capacitors (e.g., MOSCAPs), various microelectromechanical systems (MEMS), various nanoelectromechanical systems (NEMS), various radio frequency (RF) devices, various sensors, and/or any other suitable semiconductor or IC devices, depending on the end use or target application. Accordingly, in some embodiments, the structures described herein are included in system-on-chip (SoC) applications.

As previously described, in some embodiments, the body 310 is merely a top portion of substrate 300 that may or may not be formed into a desired shape (e.g., a fin) using patterning and/or lithography techniques, for example. However, in other embodiments, the body 310 includes material that is different from and not native to the material of underlying substrate 300. For instance, in some embodiments, body 310 can be formed by blanket depositing (on at least a portion of substrate 300) a layer of the channel material and then patterning that layer of channel material into body 310, for example. In another embodiment, body 310 can be formed in dielectric (or insulator) material trenches, which can be achieved by forming the top of the substrate into fins, forming the dielectric material around the fins, and then recessing or removing the fins via etching to form the trenches, for example. In some such embodiments, the dielectric material can then be recessed to expose more of the body of replacement material (e.g., which may be shaped like a fin for non-planar configurations), while in other embodiments, the dielectric material is not recessed (e.g., for planar configurations). In some embodiments, a multilayer stack is formed either by blanket deposition or by forming the stack in the dielectric trenches to enable the subsequent formation of gate-all-around configurations, for example, where some of the layers in the stack are sacrificial and intended to be removed via selective etching (e.g., during replacement gate processing) to release the one or more bodies of channel material, as will be described in more detail herein.

In some embodiments, the body of channel material 310 includes semiconductor material. In some embodiments, body 310 includes group IV and/or group III-V semiconductor material. Thus, in some embodiments, body 310 includes one or more of germanium, silicon, tin, indium, gallium, aluminum, arsenic, phosphorous, antimony, bismuth, or nitrogen. In some embodiments, semiconductor material included in body 310 also includes dopant (with corresponding n-type and/or p-type dopant), while in other embodiments, semiconductor material included in body 310 is undoped/intrinsic. In some embodiments, body 310 is silicon (that either does or does not include dopant). In some embodiments, body 310 includes germanium-based group IV semiconductor materials, such as germanium (Ge) or silicon germanium (SiGe). In some such embodiments, the Ge concentration in body 310 is in the range of 10-100 atomic percent (or in a sub-range of 10-30, 10-50, 10-70, 20-50, 20-80, 30-50, 30-70, 30-100, 50-75, 50-100, or 70-100 atomic percent), for example. In some embodiments, body 310 includes group III-V semiconductor material, such as gallium arsenide (GaAs), indium gallium arsenide (InGaAs), indium phosphide (InP), indium arsenide (InAs), indium antimonide (InSb), gallium nitride (GaN), and/or indium gallium nitride (InGaN), to provide some examples.

In some embodiments, the body of channel material 310 includes a multilayer structure of two or more sub-layers including compositionally different material. For instance, in gate-all-around (GAA) embodiments, layer of channel material 310 is a multilayer stack including one or more sacrificial layers and one or more final layers, where the sacrificial layers are to be later removed (e.g., during replacement gate processing) to release the final layers in the channel region, thereby allowing the gate structure to be formed around those one or more final layers or body structures (which may be referred to as nanowires or nanoribbons). In some embodiments, the body/layer of channel material 310 includes grading (e.g., increasing and/or decreasing) of one or more material concentrations throughout at least a portion of body 310. In some embodiments, body 310 includes strain, either in the form of tensile strain or compressive strain, where the strain may be formed by subsequent processing (e.g., as a result of the S/D material formation). In some such embodiments, the strain is throughout the entirety of body 310, while in other embodiments, the strain is only in one or more portions of body 310 (such as the outer portions nearest the S/D regions).

In some embodiments, body of channel material 310 has a thickness (dimension in the Y-axis direction) in the range of 5-200 nm (or in a subrange of 5-25, 5-50, 5-100, 10-25, 10-50, 10-80, 10-100, 10-200, 20-80, 20-100, 20-200, 40-80, 40-120, 40-200, 50-100, 50-200, or 100-200 nm) or greater, or within any other suitable range or having any other suitable value as can be understood based on this disclosure. In some embodiments, body 310 has a thickness of at least 5, 10, 15, 20, 25, 50, 80, 100, 120, or 150 nm, and/or at most 200, 150, 120, 100, 80, 50, or 25 nm, for example. In some embodiments, body 310 is used for a planar configuration, where the channel only resides in/near the top surface of the body 310, such as where the final gate structure described herein is formed only above the body 310. In other embodiments, body 310 is used for non-planar configurations, where the channel resides in/near multiple sides of the body 310. For instance, in some non-planar embodiments, channel layer or body 310 is a fin or includes a fin-like shape, where the finned body is between portions of the final gate structure. Such configurations may be referred to as having a FinFET, tri-gate structure, or dual-gate structure. In some non-planar embodiments, a gate-all-around configuration is employed where the final gate structure is around the body 310, such that the body 310 is a nanowire or nanoribbon (where multiple nanowires or nanoribbons, and thus, multiple bodies, may be present), for example. Non-planar configurations are described in more detail herein. Note that the figures and accompanying description provided herein generally apply to both planar and non-planar configurations, unless explicitly stated otherwise.

Method 200 of FIG. 2 continues with optionally forming 204 dielectric wall structures to provide isolation between adjacent transistors, in accordance with some embodiments. Examples of the dielectric wall structures are shown in FIGS. 7A-7D as structures 320, and are included in some embodiments to, for example, provide isolation between adjacent transistors. However, they are not included in other embodiments, thereby making the structures optional. The dielectric wall structures 320 may also be referred to as self-aligned gate endcap wall structures, or other tall dielectric isolation structures. The dielectric wall structures 320, where present, can assist with depositing the sacrificial S/D layer 340, as that sacrificial layer can be formed along the sidewalls of the dielectric wall structure 320 to, for example, provide isolation between the epitaxial S/D material and those dielectric wall structures. Again, such dielectric wall structures 320 will be described in more detail with reference to FIGS. 7A-7D.

Method 200 of FIG. 2 continues with forming 206 the final (or dummy) gate structure(s), such as to form the example resulting structure of FIG. 3B, in accordance with some embodiments. Note that there is one complete gate structure shown in the middle, while partial gate structures are shown on the left and right sides. However, the relevant description of the gate structure provided herein is equally applicable to all three structures, and so, their features are identified with the same numbers. The gate structure or gate stack in the example structure of FIG. 3B is shown as a final gate structure that will be in the final integrated circuit structure, and include gate dielectric 332 and gate electrode 334. In such embodiments, the processing includes a gate-first flow (also called up-front hi-k gate processing), where the final gate structure is formed prior to performing the S/D region processing. Alternatively, in some embodiments, dummy gate structures are initially formed at 206 in a gate-last flow (also called a replacement gate or replacement metal gate (RMG) process). For instance, FIG. 3B' is a blown-out portion of FIG. 3B illustrating the alternative gate-last processing, which includes forming dummy gate structures at 206 instead of final gate structures, in accordance with some embodiments. As shown in FIG. 3B', dummy gate structure 334' was formed instead of the final gate structure, in accordance with some embodiments. The dummy gate structure 334', where employed, may include a dummy gate dielectric (e.g., dummy oxide material) and a dummy gate electrode (e.g., dummy poly-silicon material) to be used for the replacement gate process, where those dummy materials are intended to be sacrificial such that they can be later removed and replaced by the final gate structure.

Regardless of whether the final gate structure is formed using a gate-first or a gate-last process flow, it includes gate dielectric 332 and gate electrode 334. In some embodiments, the gate structure, whether final or dummy, may be formed by blanket depositing the final or dummy gate materials and then patterning the materials to the desired gate structure. However, any suitable techniques can be used to form the final and/or dummy gate structures, in accordance with some embodiments. In some embodiments, gate dielectric 332 includes an oxide (e.g., silicon dioxide), nitride (e.g., silicon nitride), high-k dielectric, low-k dielectric, and/or any other suitable material as can be understood based on this disclosure. Examples of high-k dielectrics include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. Examples of low-k dielectrics include, for instance, fluorine-doped silicon dioxide, carbon-doped silicon dioxide, porous silicon dioxide, porous carbon-doped silicon dioxide, spin-on organic polymeric dielectrics (e.g., polytetrafluoroethylene, benzocyclobutene, polynorbornenes, polyimide), spin-on silicon based polymeric dielectrics (e.g., hydrogen silsesquioxane, methylsilsesquioxane), to provide some examples. In some embodiments, an annealing process is carried out on the gate dielectric 332 to improve its quality when, for example, high-k dielectric material is employed.

In some embodiments, the gate dielectric 332 includes oxygen. In some such embodiments where the gate dielectric 332 includes oxygen, the gate dielectric 332 also includes one or more other materials, such as one or more of hafnium, silicon, lanthanum, aluminum, zirconium, tantalum, titanium, barium, strontium, yttrium, lead, scandium, zinc, lithium, or niobium. For instance, the gate dielectric 332 may include hafnium and oxygen (e.g., in the form of hafnium oxide or hafnium silicon oxide), or the gate dielectric 332 may include silicon and oxygen (e.g., in the form of silicon dioxide, hafnium silicon oxide, or zirconium silicon oxide), in accordance with some embodiments. In some embodiments, the gate dielectric 332 includes nitrogen. In some such embodiments where the gate dielectric 332 includes nitrogen, the gate dielectric 332 may also include one or more other materials, such as silicon (e.g., silicon nitride) for instance. In some embodiments, the gate dielectric 332 includes silicon and oxygen, such as in the form of one or more silicates (e.g., titanium silicate, tungsten silicate, niobium silicate, and silicates of other transition metals). In some embodiments, the gate dielectric 332 includes oxygen and nitrogen (e.g., silicon oxynitride or aluminum oxynitride).

In some embodiments, the gate dielectric 332 includes a multilayer structure, including two or more compositionally distinct layers. For example, a multilayer gate dielectric can be employed to obtain desired electrical isolation and/or to help transition from the body 310 to gate electrode 334, in accordance with some embodiments. In an example embodiment, a multilayer gate dielectric has a first layer nearest the body 310 that includes oxygen and one or more materials included in the body 310 (such as silicon and/or germanium), which may be in the form of an oxide (e.g., silicon dioxide or germanium oxide), and the multilayer gate dielectric also has a second layer farthest from the body 310 (and nearest the gate electrode 334) that includes at least one high-k dielectric (e.g., hafnium and oxygen, which may be in the form of hafnium oxide or hafnium silicon oxide). In some embodiments where a multilayer gate dielectric is employed, the structure includes a first sub-layer that is only between the gate electrode 334 and the body 310, and a second sub-layer that is both between the gate electrode 334 and the body 310 as well as along sidewalls of the gate electrode 334 (e.g., between gate electrode and spacers 336). This may be achieved via replacement gate processing, where the final gate dielectric 332 is formed along sidewalls of dielectric material after the dummy gate structure (e.g., 334') is removed. In some embodiments, gate dielectric 332 includes grading (e.g., increasing and/or decreasing) the content/concentration of one or more materials through at least a portion of the gate dielectric, such as the oxygen content/concentration within the gate dielectric 332.

In some embodiments, gate dielectric 332 has a thickness in the range of 1-30 nm (or in a sub-range of 1-5, 1-10, 1-15, 1-20, 1-25, 2-5, 2-10, 2-15, 2-20, 2-25, 2-30, 3-8, 3-12, 5-10, 5-15, 5-20, 5-25, 5-30, 10-20, 10-30, or 20-30 nm) or greater, for example, or within any other suitable range or having any other suitable value as can be understood based on this disclosure. In some embodiments, the thickness of gate dielectric 332 is at least 1, 2, 3, 5, 10, 15, 20, or 25 nm, and/or at most 30, 25, 20, 15, 10, 8, or 5 nm, for example. Note that the thicknesses described herein for gate dielectric 332 relate at least to the dimension between the channel layer/body 310 and gate electrode 334 (e.g., at least the dimension in the Y-axis). In embodiments where gate dielectric 332 is also on a sidewall of each of gate spacers 336 (such as is shown in FIG. 3H'), then the thickness is also the dimension between the gate electrode 334 and each of the spacers 336, as can be understood based on this disclosure. In some embodiments, the thickness of gate dielectric 332 is selected, at least in part, based on the desired amount of isolation between channel layer 310 and gate electrode 334.

In some embodiments, gate dielectric 332 provides means for electrically insulating channel layer/body 310 from gate electrode 334. In some embodiments, the characteristics of gate dielectric 332 are selected based on desired electrical properties. For instance, some embodiments employ a relatively thicker gate dielectric (e.g., at least 5 or 10 nm in thickness) and/or relatively lower-k dielectric material for the gate dielectric, such as silicon dioxide or low-k dielectric material (where the dielectric constant, k, is less than that of silicon dioxide, so less than 3.9) to help reduce parasitic capacitance issues caused between adjacent gate electrodes or between gate electrodes and adjacent S/D contacts, for example. However, in other embodiments, hi-k dielectric material is desired as such material can provide desired electrical properties for some gate configurations.

In some embodiments, gate electrode 334 includes one or more metals, such as one or more of aluminum, tungsten, titanium, tantalum, copper, nickel, gold, platinum, ruthenium, or cobalt, for example. In some embodiments, gate electrode 334 includes carbon and/or nitrogen, such as in combination with one or more of the metals in the preceding sentence, for example. For instance, in some embodiments gate electrode 334 includes titanium and nitrogen (e.g., titanium nitride), or tantalum and nitrogen (e.g., tantalum nitride), such as in a liner layer that is in direct contact with the gate dielectric, for example. Thus, in some embodiments, gate electrode 334 includes one or more metals that may or may not include one or more other materials (such as carbon and/or nitrogen). In some embodiments, gate electrode 334 includes a multilayer structure, including two or more compositionally distinct layers. For instance, in some such embodiments, one or more work function layers are employed, such as one or more metal-including layers that are formed with desired electrical characteristics. Further, in some such embodiments, the one or more metal-including layers include tantalum and/or titanium, which may also include nitrogen (e.g., in the form of tantalum nitride or titanium nitride). In some embodiments, a bulk metal structure is formed on and between a conformal layer (such as a liner layer), where the bulk metal structure includes compositionally distinct material from the conformal/liner layer. In some such embodiments, the conformal/liner layer would be "U" shaped, for example.

In some embodiments, gate electrode 334 includes a resistance reducing metal layer between a bulk metal structure and the gate dielectric, for instance. Example resistance reducing metals include, for instance one or more of nickel, titanium, titanium with nitrogen (e.g., titanium nitride), tantalum, tantalum with nitrogen (e.g., tantalum nitride), cobalt, gold, gold with germanium (e.g., gold-germanium), nickel, platinum, nickel with platinum (e.g., nickel-platinum), aluminum, and/or nickel with aluminum (e.g., nickel aluminum), for instance. Example bulk metal structures include one or more of aluminum, tungsten, ruthenium, copper, or cobalt, for instance. In some embodiments, gate electrode 334 includes additional layers, such as one or more layers including titanium and nitrogen (e.g., titanium nitride) and/or tantalum and nitrogen (e.g., tantalum nitride), which can be used for adhesion and/or liner/barrier purposes, for example. In some embodiments, the thickness, material, and/or deposition process of sub-layers within a multilayer gate electrode are selected based on a target application, such as whether the gate electrode is to be used with an n-channel device or a p-channel device. In some embodiments, the gate electrode 334 provides means for changing the electrical attributes of the adjacent channel layer/body 310 when a voltage is applied to the gate electrode 334.

In some embodiments, gate electrode 334 has a thickness (dimension in the Y-axis direction in the view of FIG. 3B) in the range of 10-100 nm (or in a sub-range of 10-25, 10-50, 10-75, 20-30, 20-50, 20-75, 20-100, 30-50, 30-75, 30-100, 50-75, or 50-100 nm) or greater, for example, or within any other suitable range or having any other suitable value as can be understood based on this disclosure. In an embodiment, gate electrode 334 has a thickness that falls within the sub-range of 20-40 nm. In some embodiments, gate electrode has a thickness of at least 10, 15, 20, 25, 30, 40, or 50 nm and/or at most 100, 50, 40, 30, 25, or 20 nm, for example. In some embodiments, gate electrode 334 includes grading (e.g., increasing and/or decreasing) the content/concentration of one or more materials through at least a portion of the structure.

FIG. 3B also shows that sidewall spacers 336, referred to generally as gate spacers (or simply, spacers), are on either side of the gate stack, in the example structure. Such spacers 336 can be formed using any suitable techniques, such as depositing the material of spacers 336 and performing spacer pattern and etch processing, for example. In some embodiments, the spacers 336 can be used to help determine the gate length and/or channel length (dimensions in the X-axis direction), and/or to help with replacement gate processing, for example. In some embodiments, spacers 336 include any suitable oxide (e.g., silicon dioxide), nitride (e.g., silicon nitride), high-k dielectric, low-k dielectric, and/or any other suitable electrically insulating material as can be understood based on this disclosure. In some embodiments, spacers 336 include silicon, oxygen, nitrogen, and/or carbon. For instance, in some embodiments, spacers 336 include silicon dioxide, silicon monoxide, silicon nitride, silicon oxynitride, or carbon-doped silicon dioxide (or other carbon-doped oxides). In some embodiments, it is desired to select material for spacers 336 that has a low dielectric constant and a high breakdown voltage. In some embodiments, spacers 336 include a multilayer structure (e.g., a bilayer structure where the sub-layers are laterally adjacent to each other in the X-axis direction), even though it is illustrated as a single layer in the example structure of FIG. 3B. In some embodiments, spacers 336 and gate dielectric 332 do not include a distinct interface as shown in FIG. 3B, particularly where spacers 336 and gate dielectric 332 include the same material, for example.

Method 200 of FIG. 2 continues with forming 208 S/D trenches, such as to form the example resulting structure of FIG. 3C including S/D trenches 350, in accordance with some embodiments. S/D trenches 350 can be formed using any suitable techniques, such as using wet and/or dry etch techniques to remove the material of channel layer 310 from the S/D locations. Note that although the S/D trenches 350 extend down (in the Y-axis direction) to exactly the top surface of substrate 300 in this example embodiment, in other embodiments, the trenches 350 may have a bottom surface that is higher or lower. Further, although the S/D trenches 350 have a flat or planar bottom surface as shown in FIG. 3C (which may be formed based on etch selectivity between channel material layer 310 and substrate 300), in other embodiments, the trenches 350 may have a curved or faceted bottom surface.

Figure 3D:
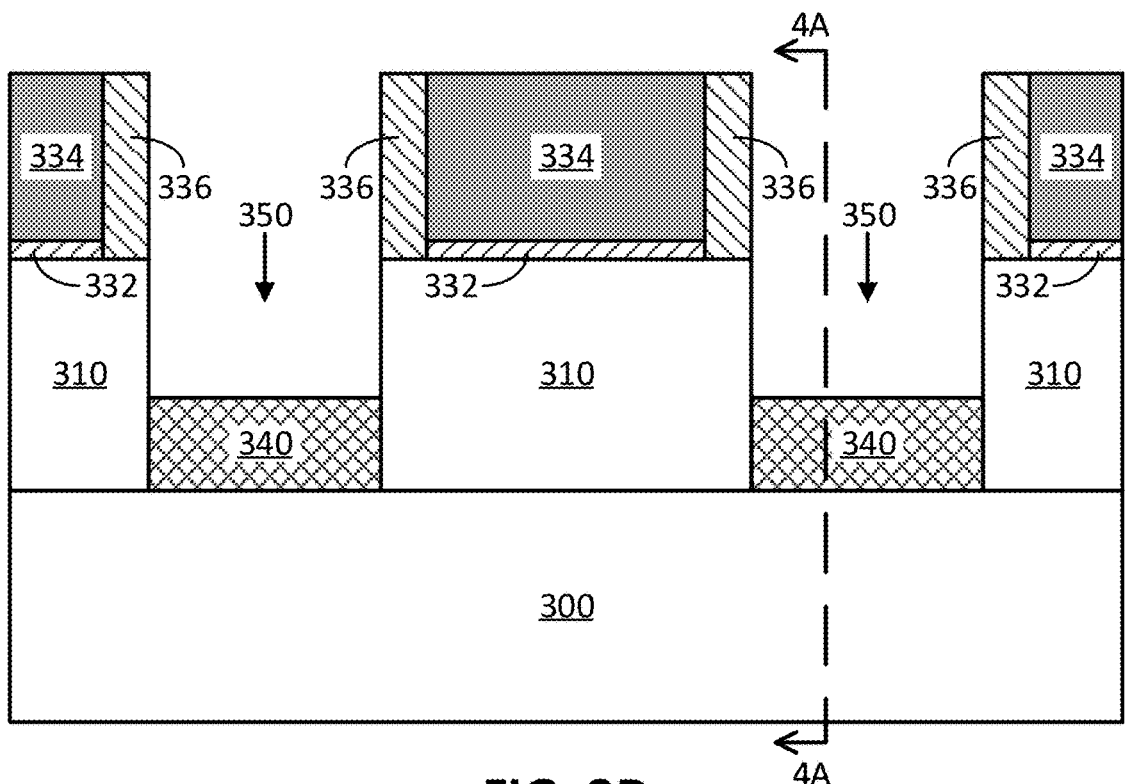

Method 200 of FIG. 2 continues with forming 210 a sacrificial layer in the S/D trenches, such as to form the example resulting structure of FIG. 3D including sacrificial layer 340, in accordance with some embodiments. Sacrificial layer 340, in some embodiments, includes material that can be selectively etched relative to the final S/D material (used for S/D regions 360). Thus, in some such embodiments, sacrificial layer 340 includes compositionally different material relative to the final S/D material. Further, in some embodiments, the material of sacrificial layer 340 is selected such that it can be selectively etched relative to dielectric wall structures 320, where such dielectric wall structures 320 are employed. Further still, in some embodiments, the material of sacrificial layer 340 is selected such that it can be selectively etched relative to the material of other exposed features during the S/D contact processing (where the sacrificial layer 340 is at least partially removed via selective etch), where such other exposed features may include, for instance, the material of one or more interlayer dielectric (ILD) layers, the material of channel layer 310, the material of substrate 300, and/or the material of hardmasks covering the gate electrode, to provide some examples. As can be understood based on this disclosure, sacrificial layer 340 acts as a space holder under the final S/D material such that when the sacrificial layer 340 is subsequently accessed and (at least partially) removed via selective etching, the space that it previously occupied can be filled with the S/D contact material to enable forming the S/D contacts 380 below the S/D regions 360.

In some embodiments, sacrificial layer 340 includes one or more dielectric materials. In some such embodiments, sacrificial layer 340 includes (or is) any suitable oxide (e.g., silicon dioxide, silicon monoxide), nitride (e.g., silicon nitride), carbide (e.g., silicon carbide), high-k dielectric, low-k dielectric, and/or any other suitable electrically insulating material as can be understood based on this disclosure. In some embodiments, sacrificial layer 340 includes silicon, oxygen, nitrogen, and/or carbon. For instance, in some embodiments, sacrificial layer 340 includes silicon dioxide, silicon monoxide, silicon nitride, silicon oxynitride, or carbon-doped silicon dioxide (or other carbon-doped oxides). In some embodiments, sacrificial layer 340 includes one or more silicates (e.g., titanium silicate, tungsten silicate, niobium silicate, and silicates of other transition metals).

In some embodiments, sacrificial layer 340 includes one or more semiconductor materials. In some such embodiments, sacrificial layer 340 includes group IV and/or group III-V semiconductor material. Thus, in some embodiments, sacrificial layer 340 includes one or more of germanium, silicon, tin, indium, gallium, aluminum, arsenic, phosphorous, antimony, bismuth, or nitrogen. In some embodiments, semiconductor material included in sacrificial layer 340 also includes dopant (with corresponding n-type and/or p-type dopant), while in other embodiments, semiconductor material included in body 310 is undoped/intrinsic. Recall that in some embodiments, sacrificial layer 340 includes compositionally different material from S/D regions 360. Recall, materials that are "compositionally different" or "compositionally distinct" as used herein refers to two materials that have different chemical compositions. This compositional difference may be, for instance, by virtue of an element that is in one material but not the other (e.g., silicon germanium is compositionally different from silicon and silicon dioxide is compositionally different from silicon), or by way of one material having all the same elements as a second material but at least one of those elements is intentionally provided at a different concentration in one material relative to the other material (e.g., SiGe having 70 atomic percent germanium is compositionally different from SiGe having 25 atomic percent germanium). In addition to such chemical composition diversity, the materials may also have distinct dopants (e.g., boron versus arsenic/phosphorous) or the same dopants but at differing concentrations. In still other embodiments, compositionally different materials may further refer to two materials that have different crystallographic orientations. For instance, (110) Si is compositionally distinct or different from (100) Si.

In some embodiments, sacrificial layer 340 has a thickness (dimension in the Y-axis direction of FIG. 3D) in the range of 2-50 nm (or in a sub-range of 2-5, 2-10, 2-25, 3-8, 3-12, 3-20, 5-10, 5-25, 5-50, 10-25, 10-50, or 25-50 nm) or greater, or any other thickness value or range as can be understood based on this disclosure. In some embodiments, sacrificial layer 340 has a thickness of at least 2, 3, 5, 8, 10, 12, 15, 20, or 25 nm and/or at most 50, 35, 25, 20, 15, 12, 10, 8, or 5 nm, for example. In some embodiments, a thickness of at least 2 nm may be employed to ensure that substrate is adequately covered and to ensure that the material can be subsequently removed to enable forming the S/D contacts 380 below the S/D regions 360, as is described in more detail herein.

FIGS. 4A-4D illustrate example cross-sectional views of a plane taken through a S/D region of the structures of FIGS. 3D, 3E, 3G, and 3H, respectively, to help show the processing described herein, in accordance with some embodiments. For instance, the cross-sectional view in FIG. 4A is indicated by the 4A-4A dashed line in FIG. 3D. Note that the structures of FIGS. 4A-4D show isolation regions 370. In some embodiments, isolation regions 370, which may be referred to as shallow trench isolation (STI) regions 370, include one or more dielectrics. In some such embodiments, the dielectric material included in isolation regions 370 includes any suitable oxide (e.g., silicon dioxide), nitride (e.g., silicon nitride), high-k dielectric, low-k dielectric, and/or any other suitable electrically insulating material as can be understood based on this disclosure. In some embodiments, isolation regions 370 include silicon, oxygen, nitrogen, and/or carbon. For instance, in some embodiments, isolation regions 370 includes silicon dioxide, silicon monoxide, silicon nitride, silicon oxynitride, or carbon-doped silicon dioxide (or other carbon-doped oxides). The other features of the structures are apparent in light of this disclosure.

Figure 3E:
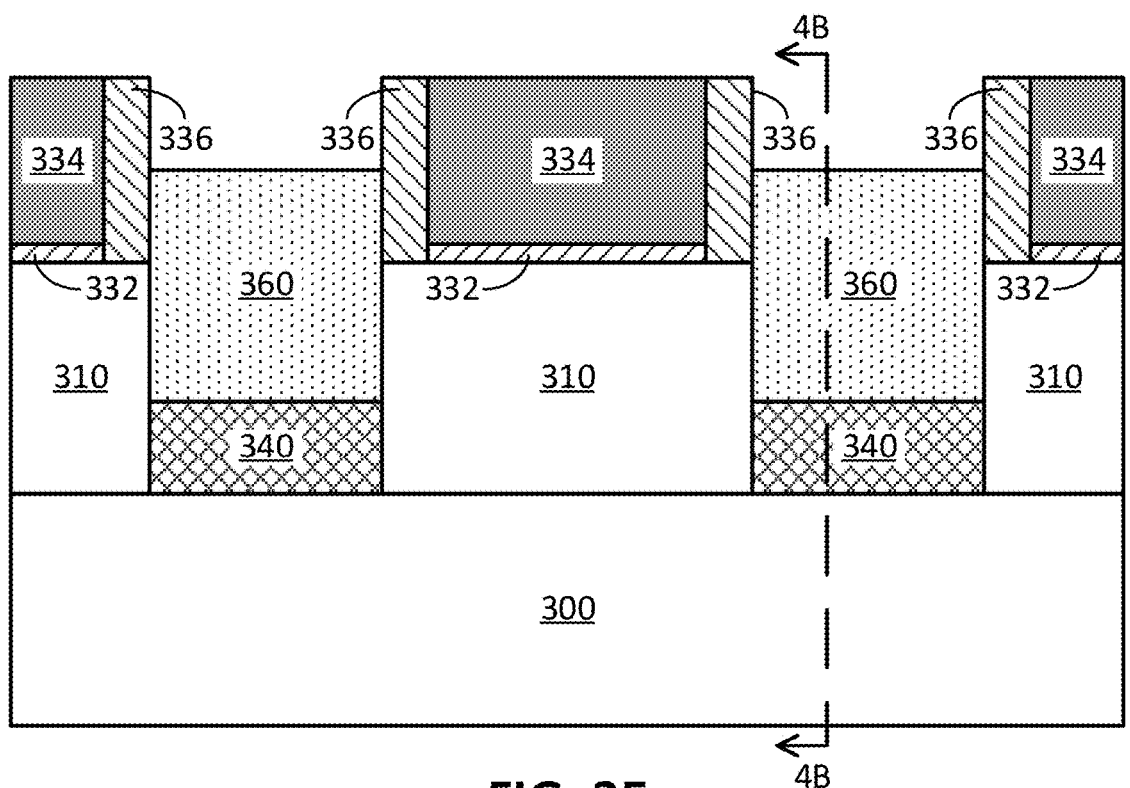

Method 200 of FIG. 2 continues with forming 212 S/D regions in the S/D trenches, such as to form the example resulting structure of FIG. 3E which includes S/D regions 360 formed in trenches 350, in accordance with some embodiments. Note that the source region and the drain region are referred to herein as simply S/D regions 360 for ease of description, as either of the regions 360 may be the source region thereby making the other region 360 the drain region. In other words, how the transistor device is electrically connected and/or how it operates can dictate which region 360 is the source region and which is the drain region.

For instance, in some embodiments, the left S/D region 360 in the structure of FIG. 3E is the source region and the right S/D region 360 is the drain region, and vice versa in other embodiments (left region 360 is the drain and right region 360 is the source). Also note that the cross-sectional view in FIG. 4B is indicated by the 4B-4B dashed line in FIG. 3E.

In some embodiments, the S/D regions 360 can be formed using any suitable techniques. For instance, in embodiments where sacrificial layer 340 includes dielectric material, the material of S/D regions 360 may epitaxially grow only from the exposed semiconductor material of channel layer 310. However, in embodiments where sacrificial layer 340 includes semiconductor material, the material of S/D regions 360 may grow from both the exposed semiconductor material of channel layer 310 and from the top surface of sacrificial layer 340.

In some embodiments, the epitaxial growth or deposition of the semiconductor material of S/D regions 360 is performed such that the growth from both sides of trench 350 merges to form S/D regions 360 such as those shown in FIG. 3E. In some such embodiments, processing may then be performed to achieve the example structure of FIG. 3F, where a trench or opening 352 is formed in the S/D regions 360 to gain access to the underlying sacrificial layer 340, for example. Such processing includes a deep etch that punches through the S/D regions 360 and stops at sacrificial layer 340, for example. For instance, the etch may include masking off the sides of the S/D regions 360 that remain and only having an opening where the eventual trench 352 is formed, and then performing a highly-directional etch down through the exposed S/D region such as to form the structure of FIG. 3F. This deep etch processing may be performed prior to replacement gate processing or after (such as during source drain contact processing). In embodiments where the deep etch is performed before replacement gate processing (where such replacement gate processing occurs), additional sacrificial layer material 341 may be deposited in trench 352 to form the example resulting structure of FIG. 3F' (which also shows the replacement gate structure formed). Note that sacrificial material 341 may or may not be compositionally distinct to sacrificial material 340.

Figure 3F:
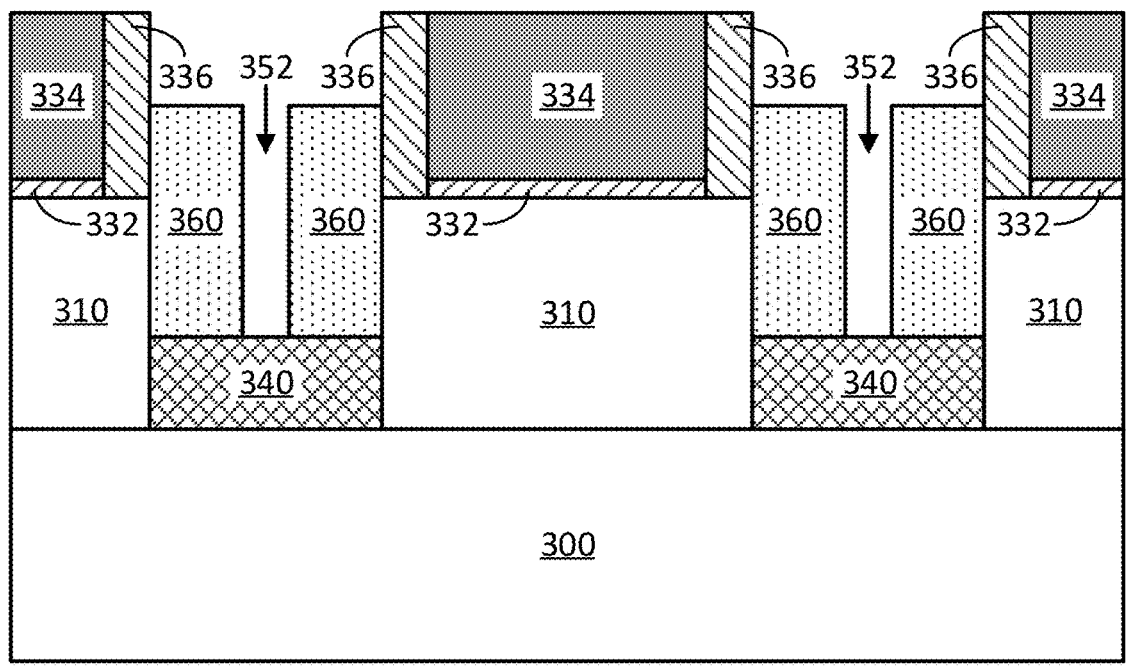
Figure 3H:
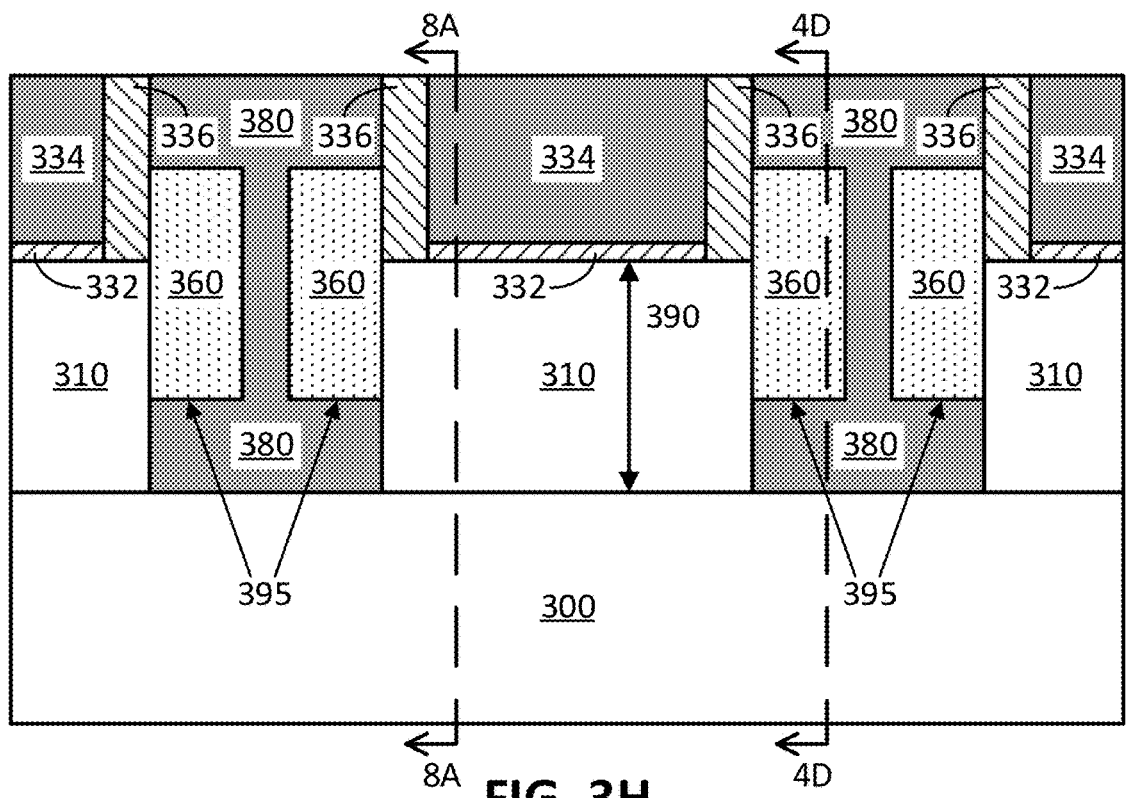
Figure 3H:
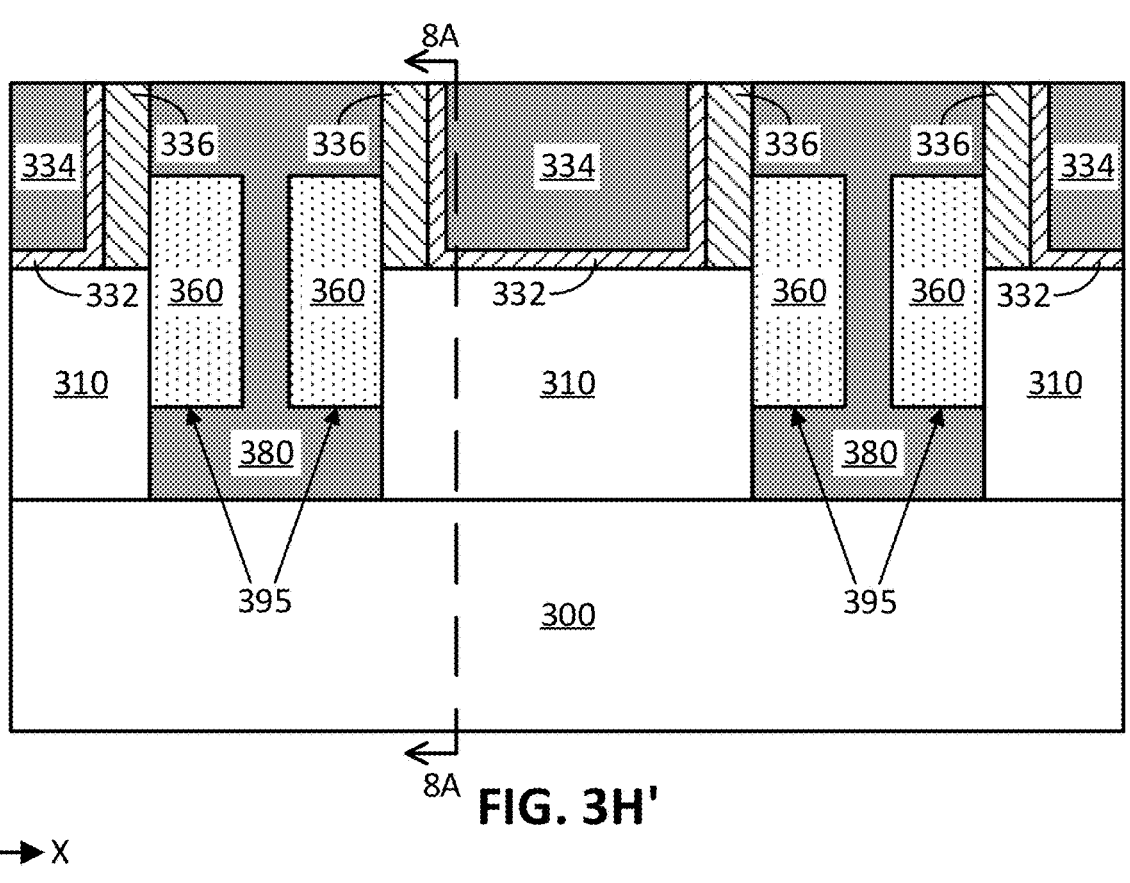

In other embodiments, the epitaxial growth of the semiconductor material of S/D regions 360 is controlled such that it is interrupted prior to the merging of the adjacent portions of S/D material. In some such embodiments, the structure of FIG. 3F is formed in the first instance, without the intervening structure of FIG. 3E having been formed. The epi growth to prevent merging of adjacent portions of S/D material (e.g., as shown in FIG. 3F) can be controlled based on the time of the deposition process, for example. Again, in embodiments employing replacement gate processing, additional sacrificial layer material 341 may be deposited in trench 352 to form the example resulting structure of FIG. 3F' (which also shows the replacement gate structure formed). Note that there may be no observable interface as shown between the initial sacrificial layer 340 and the additional sacrificial material 341. Note that although trench 352 is shown in FIG. 3F as being in the middle of original S/D trench 350, such a depiction is for ease of illustration and the present disclosure should not be so limited. Also note that in some embodiments, trench 352 has a width (dimension in the X-axis direction) between the portions of S/D material 360 of at least 2, 3, 4, or 5 nm, where such a threshold width may be utilized to ensure that the underlying sacrificial layers 341 and 340 can be accessed for (at least partial) removal via the selective etch processing described herein.

Figure 6:
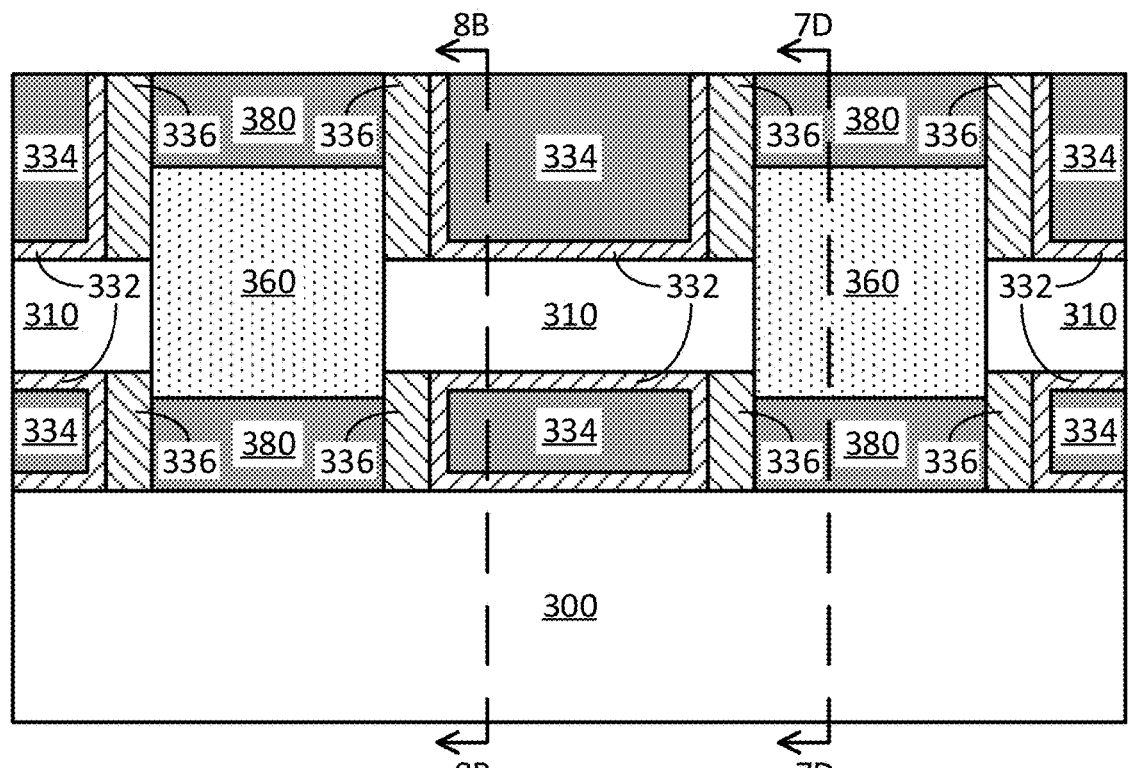
FIG. 6 illustrates a cross-sectional view of an example integrated circuit structure including increased source/drain contact area and employing a gate-all-around (GAA) configuration, in accordance with some embodiments.

In still other embodiments, such a trench or opening 352 need not be formed in the S/D regions 360 when employing dielectric wall structures 320, as will be described in more detail below with reference to FIGS. 6 and 7A-7D. In such embodiments, the S/D regions 360 need not be separated, as the processing to remove sacrificial layer 340 can be performed on the sides of the S/D regions 360 between those regions and the adjacent dielectric wall structures 320. In other words, in some such embodiments, the sacrificial layer 340 under the S/D regions 360 can be accessed by going around the S/D regions 360 (such as is shown in FIGS. 7A-7D) instead of going through it (such as is shown in FIGS. 3F and 3G), thereby resulting in a structure having its S/D region in tact between adjacent bodies of channel material 310 (such as is shown in FIG. 6).

S/D regions 360, in some embodiments, include semiconductor material. In some such embodiments, S/D regions 360 include group IV and/or group III-V semiconductor material. In some embodiments, S/D regions 360 include the same group-type of semiconductor material that channel layer 310 includes. For instance, in some such embodiments where channel layer 310 includes group IV semiconductor material (e.g., Si, SiGe, Ge), S/D regions 360 also include group IV semiconductor material. Further, in some such embodiments where channel layer 310 includes group III-V semiconductor material (e.g., GaAs, InGaAs, InP), S/D regions 360 also include group III-V semiconductor material. In some embodiments, S/D regions 360 include one or more of silicon, germanium, tin, carbon, indium, gallium, aluminum, arsenic, nitrogen, phosphorous, arsenic, or antimony. For instance, in an example embodiment, S/D regions 360 include semiconductor material that includes germanium (e.g., in a concentration in the range of 1-100 atomic percent), which may or may not also include silicon (e.g., in the form of Ge or SiGe). In another example embodiment, S/D regions 360 include gallium and arsenic, which may or may not also include indium (e.g., in the form of GaAs or InGaAs).

In some embodiments, the S/D regions 360 include the same semiconductor material as one another (e.g., where they are processed simultaneously), while in other embodiments, the S/D regions 360 include compositionally distinct semiconductor material from one another (e.g., where they are processed separately using masking techniques). Further, in some embodiments, the semiconductor material included in S/D regions 360 includes dopant, such as n-type and/or p-type dopant. For instance, in some embodiments, both S/D regions 360 include n-type dopant (e.g., in an NMOS device), while in other embodiments, both S/D regions 360 include p-type dopant (e.g., in a PMOS device). In still other embodiments, one of the S/D regions 360 includes n-type dopant, while the other of the S/D regions 360 includes p-type dopant, such as in a configuration that employs quantum tunneling (e.g., in a TFET device).

In some embodiments, one or both of S/D regions 360 include a multilayer structure that includes at least two compositionally distinct material layers or portions. For instance, in some such embodiments employing a multilayer S/D region, there may be a first portion nearest channel layer/body 310 and a second portion nearest S/D contact structure 380, where the first and second portions include compositionally different materials. For example, the second portion may include a relatively higher amount of dopant than the first portion, which may help prevent diffusion of undesired dopant into the adjacent channel layer/body 310 and/or help reduce contact resistance. In another example, the first portion includes a first semiconductor material and the second portion includes a second semiconductor material different from the first semiconductor material. For instance, the first portion may include Si or SiGe with a relatively low Ge concentration (e.g., 0-30 atomic percent), while the second portion may include SiGe or Ge with a relatively high Ge concentration (e.g., 30-100 atomic percent). In some embodiments, one or both of S/D regions 360 include grading (e.g., increasing and/or decreasing) of the concentration of one or more materials within the feature. For example, the atomic percent concentration of a semiconductor compound can be graded or changed throughout at least a portion of a S/D region 360, such as the concentration of Ge or In in the region. In another example, the concentration of dopant is graded in a S/D region 360, such as having the concentration be relatively lower near channel layer/body 310 and relatively higher near the corresponding S/D contact structure 380. This can be achieved by tuning the amount of dopant in the reactant flow (e.g., during an in-situ doping scheme), for example. Further, such a graded configuration can help prevent diffusion of undesired dopant into the channel layer/body 310 and/or help reduce contact resistance, for example.

Method 200 of FIG. 2 continues with optionally forming 214 the final gate structures if dummy gate structures were employed in a gate-last process flow, in accordance with some embodiments. Recall that if such a gate-last process flow is employed via replacement gate processing, then additional sacrificial material 341 may be formed in trench 352 of FIG. 3F, such as to form the example resulting structure of FIG. 3F'. This helps protect the S/D regions 360 during such replacement gate processing. The example structures of FIGS. 3F' and 3H' illustrate that the dummy gate structure (such as dummy gate structure 334' shown in FIG. 3B') was removed and replaced with the final gate structure, in accordance with some embodiments. The final gate structure or stack still includes gate dielectric 332 and gate electrode 334, which is the same as the gate-first process flow resulting in the example structure of FIG. 3H. However, as the gate-last process flow structure of FIGS. 3F' and 3H' forms the final gate structures in trenches between gate spacers 336 after the removal of the dummy gate structures, the final gate dielectric in those structures is not only formed on the bottom of that trench, but also on the trench sidewalls, as shown. As can be understood, gate dielectric is a conformal layer within that trench. Thus, in some embodiments, gate dielectric 332 has a "U" shape such as is shown in FIGS. 3F' and 3H'.

Method 200 of FIG. 2 continues with performing 216 S/D contact processing, such as to form the example resulting structures of FIGS. 3H and 3H' that include S/D contact structures 380, in accordance with some embodiments. Note that the source contact structure and the drain contact structure may simply be referred to herein as S/D contact structures 380 for ease of description, as either of the contact structures 380 may be to the source region thereby making the other contact structure 380 to the drain region. In other words, in some embodiments, the left S/D region 360 is the source region and thus corresponding contact structure 380 would be the source contact structure, making the right S/D region 360 the drain region and thus corresponding contact structure 380 would be the drain contact structure, while in other embodiments, the opposite configuration applies, with the source on the right and the drain on the left. Also note that the interface 395 between S/D contact 380 and S/D region 360 of FIGS. 3H and 3H' is increased relative to the interface 195 of FIG. 1. Thus, the structures described herein and enabled through sacrificial S/D layer processing have significantly larger contact area than typical state-of-the-art top-interface contact devices, as can be understood based on this disclosure.

The S/D contact processing 216 includes at least partially removing sacrificial layer 340 (and additional sacrificial layer 341, where employed) to enable forming the S/D contacts 380 below the S/D regions 360, such as to form the example resulting structure of FIG. 3G, in accordance with some embodiments. Such processing can use wet and/or dry etch techniques that selectively removes the material of sacrificial layer 340 (and additional sacrificial layer 341, where employed) relative to the material of S/D regions 360. For instance, as described herein, the materials included in sacrificial layers 341, 340 and S/D regions 360 can be selected to ensure a desired amount of etch selectivity between the materials, such that sacrificial layers 341 and 340 can be removed using one or more etchants at a rate that is relatively faster than the rate that the one or more etchants remove S/D regions 360. In some embodiments, for a given etchant, material included in sacrificial layers 341 and 340 can be selectively removed relative to the material included in S/D regions 360, such that the given etchant removes the material in sacrificial layers 341 and 340 at least 2, 3, 4, 5, 10, 15, 20, 25, 50, or 100 times faster than the given etchant removes the material in S/D regions. In some embodiments, all of sacrificial layers 341 and 340 are removed, such as is shown in FIG. 3G. However, in other embodiments, a remainder of sacrificial layer 340 may remain, such as at the bottom of the trenches 354 as shown in the blown-out portion of FIG. 3G'. In either such cases, the techniques described herein that employ sacrificial layer 340 can be detected based on such a remnant or artifact of the sacrificial layer 340. Note that trenches 350, 352, and 354 are all in the S/D regions, but they relate to the trenches at various stages of the processing. Also note that the cross-sectional view in FIG. 4C is indicated by the 4C-4C dashed line in FIG. 3G. Numerous different material combinations and sacrificial removal techniques can be understood based on this disclosure.

After sacrificial layer 340 (and additional sacrificial layer 341, where employed) has been at least partially removed, the S/D contact processing includes forming the S/D contacts 380 in trenches 354, such as to form the example structures of FIGS. 3H and 3H', in accordance with some embodiments. Note that the cross-sectional view in FIG. 4D is indicated by the 4D-4D dashed line in FIG. 3H. In some embodiments, the S/D contacts 380 are deposited using ALD and/or CVD processes, for instance, which enables deposition of the metal all around the S/D regions 360, for example, including the underside of the S/D regions (and between portions of the S/D regions 360 in neighboring cells and/or along the sidewalls of the S/D regions 360 between the dielectric wall structures 320, where applicable). In some embodiments, the S/D contact processing 216 includes silicidation, germanidation, and/or III-V-idation to form a mixture of one or more metals with the exposed semiconductor material surface of the S/D regions 360. In some cases, the mixture of the metal and semiconductor material is referred to as an intermetallic region.

In some embodiments, one or both of the S/D contact structures 380 include a resistance reducing metal and a contact plug metal, or just a contact plug, for instance. Example contact resistance reducing metals include, for instance, nickel, titanium, titanium with nitrogen (e.g., in the form of titanium nitride), tantalum, tantalum with nitrogen (e.g., in the form of tantalum nitride), cobalt, gold, gold-germanium, nickel-platinum, nickel aluminum, and/or other such resistance reducing metals or alloys. Example contact plug metals include, for instance, aluminum, tungsten, ruthenium, or cobalt, although any suitable conductive material could be employed. In some embodiments, additional layers are present in the S/D contact trenches, where such additional layers would be a part of the S/D contact structures 380. Examples of additional layers include adhesion layers and/or liner/barrier layers, that include, for example, titanium, titanium with nitrogen (e.g., in the form of titanium nitride), tantalum, and/or tantalum with nitrogen (e.g., in the form of tantalum nitride). Another example of an additional layer is a contact resistance reducing layer between a given S/D region 360 and its corresponding S/D contact structure 380, where the contact resistance reducing layer includes semiconductor material and relatively high dopant (e.g., with dopant concentrations greater than 1E19, 1E20, 1E21, 5E21, or 1E22 atoms per cubic cm), for example.

In some embodiments, a dielectric layer (not shown) may be between the top portion of S/D contacts 380 and gate sidewall spacers 336. In some such embodiments, the dielectric layer includes any suitable oxide (e.g., silicon dioxide), nitride (e.g., silicon nitride), high-k dielectric, low-k dielectric, and/or any other suitable electrically insulating material as can be understood based on this disclosure. In some embodiments, the dielectric layer includes silicon, oxygen, nitrogen, and/or carbon. For instance, in some embodiments, the dielectric layer includes silicon dioxide, silicon monoxide, silicon nitride, silicon oxynitride, or carbon-doped silicon dioxide (or other carbon-doped oxides). In some embodiments, it is desired to select material for the dielectric layer that has a low dielectric constant and a high breakdown voltage. In some embodiments, to decrease dielectric constant, the dielectric layer is formed to be intentionally porous, such as including at least one porous carbon-doped oxide (e.g., porous carbon-doped silicon dioxide). In embodiments where the dielectric layer is porous, it includes a plurality of pores throughout at least a portion of the layer. In some embodiments, the dielectric layer includes a multilayer structure. Note that such a dielectric layer may be referred to as an interlayer dielectric (ILD) structure, in some cases.

Method 200 of FIG. 2 continues with completing 218 integrated circuit processing, as desired, in accordance with some embodiments. Such additional processing to complete the integrated circuit can include back-end or back-end-of-line (BEOL) processing to form one or more metallization layers and/or to interconnect the devices formed during the front-end or front-end-of-line (FEOL) processing, such as the transistor devices described herein. Note that the processes 202-218 of method 200 are shown in a particular order for ease of description, in accordance with some embodiments. However, in some embodiments, one or more of the processes 202-218 are performed in a different order or need not be performed at all. For example, box 204 is an optional process that need not be performed, in some embodiments. Further, box 214 is an optional process that need not be performed in embodiments employing a gate-first process flow, for example. Numerous variations on method 200 and the techniques described herein will be apparent in light of this disclosure.

Figure 5:
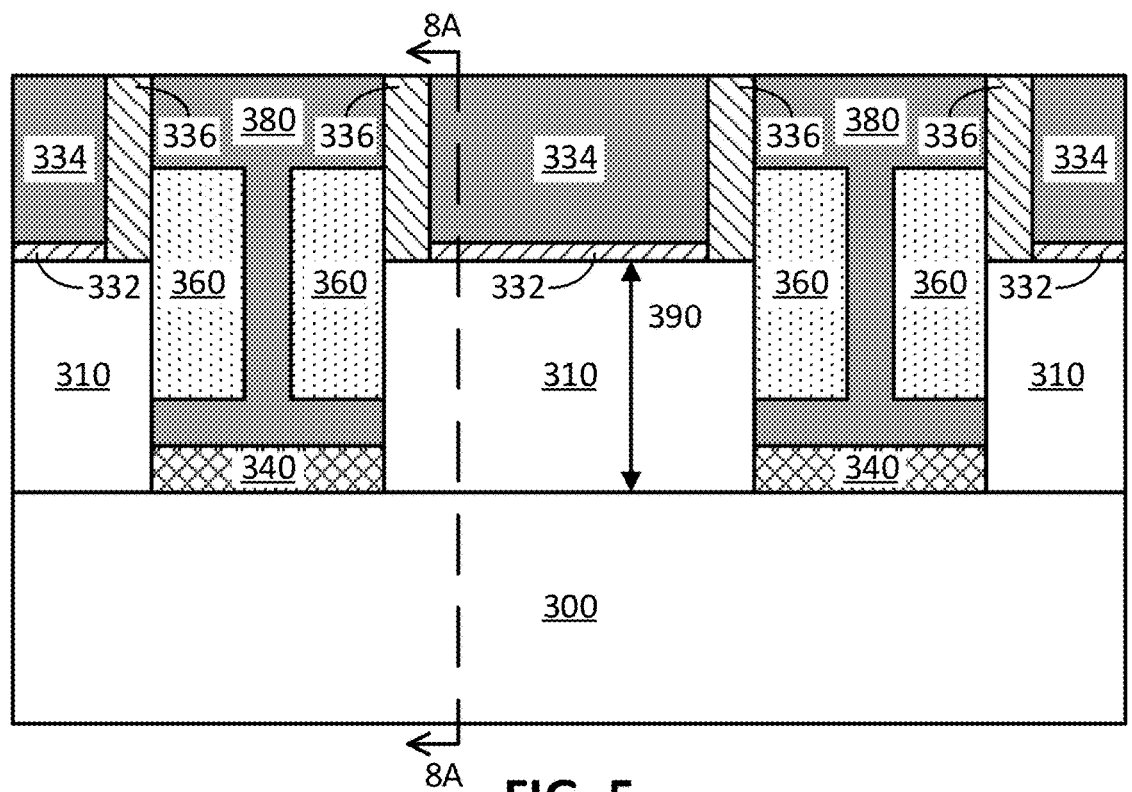
FIG. 5 illustrates the example integrated circuit structure of FIG. 3H, illustrating a portion of the sacrificial source/drain layer remaining in the final structure, in accordance with some embodiments.

FIG. 5 illustrates the example integrated circuit structure of FIG. 3H, illustrating a portion of sacrificial layer 340 remaining in the final structure, in accordance with some embodiments. Recall that as shown in the blown-out portion of FIG. 3G', the sacrificial layer 340 may only be partially removed via the selective etch processing, such that a portion of sacrificial layer 340 remains in the final structure, such as is shown in FIG. 5. In some such embodiments, such remaining sacrificial layer 340 portion is intentionally kept to, for example, help isolate the S/D contacts 380 from the underlying substrate 300. In embodiments where a portion of sacrificial layer 340 remains at the bottom of the S/D trenches, the remaining thickness of that sacrificial layer portion (dimension in the Y-axis direction in the example structure of FIG. 5) may be at least 1, 2, 3, 4, or 5 nm and/or at most 10, 8, 6, or 5 nm, for example, or any other thickness value or range as can be understood based on this disclosure. Note that at least a portion of sacrificial layer 340 can remain in the end structure regardless of whether a gate-first process flow is employed (e.g., resulting in the structure of FIG. 3H, such as is shown in FIG. 5) or a gate-last process flow is employed (e.g., resulting in the structure of FIG. 3H'). Note that observing the remaining portions of sacrificial layer 340 may be useful in detecting the techniques and structures described in this disclosure.

Figure 8A:
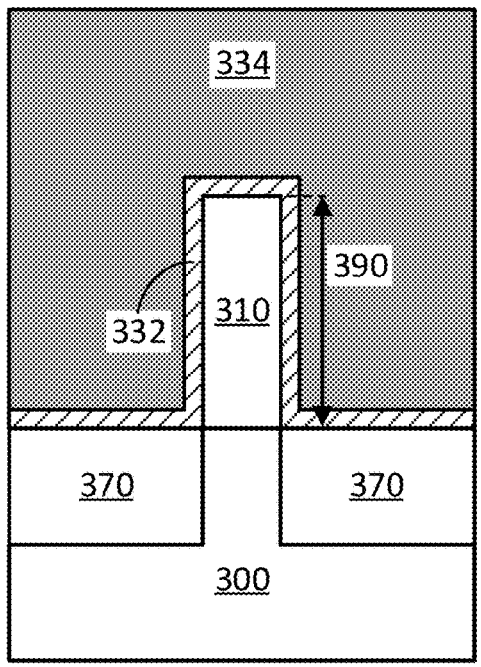
FIGS. 8A-8D illustrate example cross-sectional integrated circuit views through the channel region and gate structure of transistor devices described herein, in accordance with some embodiments. For instance.

Note that the structures described herein are primarily described and shown in the context of non-planar transistor configurations; however, in some embodiments, the techniques can be used for planar transistor configurations. Planar transistor configurations relate to where the gate structure (e.g., gate dielectric 332 and gate electrode 334) is only above or otherwise adjacent to only one side of channel layer or body 310. Non-planar transistor configurations relate to where the gate structure (e.g., gate dielectric 332 and gate electrode 334) is adjacent to multiple sides of channel layer or body 310. For instance, the example integrated circuit structures of FIGS. 3H, 3H' and 5 include finned transistor configurations, such as for FinFET devices, where the active height of the fin is indicated by 390 in the figures. The fin is better illustrated in FIG. 8A, which is along the dashed line 8A-8A shown in FIGS. 3H, 3H' and 5. In FIG. 8A, body 310 is a fin or fin-shaped, and in addition to being below the gate structure (including gate dielectric 332 and gate electrode 334), body 310 is also between two portions of the gate structure as shown. As is also shown, active height 390 relates to the height of the portion of the fin that extends above the top plane of the isolation or STI regions 370.

Figure 8B:
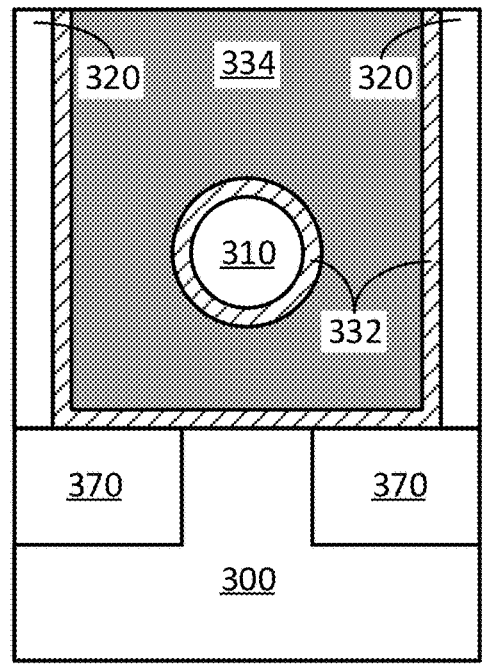
Figure 8C:
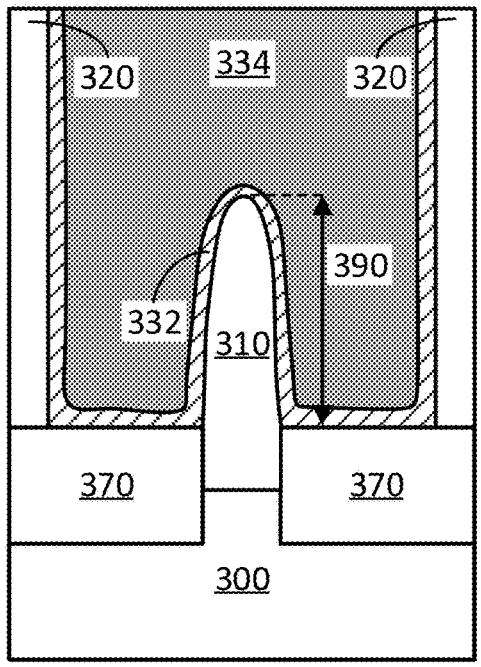

In embodiments employing a finned transistor configuration (e.g., where the body 310 is a fin, such as is show in FIGS. 8A and 8C), the fins can be formed using any suitable techniques, such as blanket depositing the body of channel material and patterning the blanket-deposited layer into fins as desired. Another technique includes forming fins in the top of substrate 300, forming isolation regions including dielectric material in the trenches between fins, recessing or removing the substrate-based fins to make trenches between the isolation regions, depositing the material of body 310 to form fins in those trenches, and then recessing the isolation regions to expose the fins and allow them to protrude or extend above a top surface of the isolation regions. For instance, isolation regions 370 in FIG. 8A may be those recessed isolation regions in such cases). FIG. 8C illustrates the same view of FIG. 8A, but with a different fin-shaped body, where the body 310 includes a rounded or curved top surface (as opposed to a flat or planar top surface, as shown in the structure of FIG. 8A). Further, the structure of FIG. 8C includes dielectric wall structures 320, as described herein. Further still, the structure of FIG. 8C shows that a portion of body 310 extends down to the sub-fin region that is below the active height 390 (as opposed to all of body 310 being a part of the active height 390 in the structure of FIG. 8A).

In some embodiments employing a finned configuration, the fin-shaped body (e.g., 310 in FIGS. 8A and 8C) has a width (dimension in the Z-axis direction) in the range of 2-100 nm (or in a subrange of 2-10, 2-25, 2-40, 2-50, 2-75, 4-10, 4-25, 4-40, 4-50, 4-75, 4-100, 10-25, 10-40, 10-50, 10-75, 10-100, 25-40, 25-50, 25-75, 25-100, or 50-100 nm) or greater, or any other suitable value or range as can be understood based on this disclosure. In some embodiments, the fin-shaped body has a width of at least 2, 5, 8, 10, 15, 20, 25, or 50 nm, and/or a width of at most 100, 75, 50, 40, 30, 25, 20, 15, 12, or 10 nm, for example. In some embodiments employing a finned configuration, the active height 390 of the fin-shaped body is a height (dimension in the Y-axis direction) in the range of 5-200 nm (or in a subrange of 5-25, 5-50, 5-100, 10-25, 10-50, 10-80, 10-100, 10-200, 20-80, 20-100, 20-200, 40-80, 40-120, 40-200, 50-100, 50-200, or 100-200 nm) or greater, or any other suitable value or range as can be understood based on this disclosure. In some embodiments, the fin-shaped body has an active height 390 of at least 5, 10, 15, 20, 25, 50, 80, 100, 120, or 150 nm, and/or at most 200, 150, 120, 100, 80, 50, or 25 nm, for example. In some embodiments employing a finned configuration, the active height 390 to width ratio of the fins is greater than 1, such as greater than 1.5, 2, 2.5, 3, 4, 5, 6, 7, 8, 9, or 10, or greater than any other suitable threshold ratio. Numerous different shapes and configurations for the body of channel material (or channel region) of the transistor will be apparent in light of this disclosure.

FIG. 6 illustrates a cross-sectional view of an example integrated circuit structure including increased S/D contact area and employing a gate-all-around (GAA) configuration, in accordance with some embodiments. The structure of FIG. 6 is similar to that of FIG. 3H', as both structures were formed with a gate-last process flow, except that the structure of FIG. 3H' (as well as in the structures of FIGS. 3H and 5) has a finned configuration where the active height of the fin is indicated as 390, as opposed to the gate-all-around configuration of FIG. 6. In addition, the S/D regions 360 in the structure of FIG. 6 are not separated in the middle (e.g., trench 352 and contacts 380 are not present between portions of the S/D regions 360) as they are in the structure of FIG. 3H' (as well as in the structures of FIGS. 3H and 5). This is because dielectric wall structures 320 were employed for the structure of FIG. 6, resulting in the sacrificial layer 340 being able to be accessed to the sides of the S/D regions 360, as described in more detail below with respect to FIGS. 7A-7D.

Again, the structure of FIG. 6 is similar to the structure of FIG. 3H', and thus all relevant description of that structure applies equally to the structure of FIG. 6. However, as shown in FIG. 6, the gate structure (including gate dielectric 332 and gate electrode 334) wraps around body 310 in a gate-all-around (GAA) configuration. Thus, in this example structure, body 310 may be considered a nanowire or nanoribbon, for example. Such a structure is also shown in FIG. 8B, for example, which is the view along dashed line 8B-8B in FIG. 6. Such a structure can be formed using an initial multilayer stack including one or more sacrificial layers and one or more non-sacrificial layers (such as the layer that becomes body 310). The sacrificial layer(s) of the multilayer stack can then be removed via selective etch processing to release the non-sacrificial layer(s) to be used as the body(ies) of channel material. Thus, the material of sacrificial layer(s) be selectively etched relative to the material of body 310 using a given etchant. Such selective etch processing can occur, for example, during process 214 where the replacement gate processing occurs. Examples of suitable materials for the selective etch processing are provided herein, such as layers of the channel material including SiGe or Ge, while the sacrificial layers include Si or SiGe (with relatively lower Ge concentration, such as at least 20 atomic percent lower Ge). In some embodiments, the stack of nanowires or nanoribbons (even just including the final layers after the sacrificial layers are removed) may be considered fin-shaped. In some embodiments, a nanoribbon may have a height to width ratio as described for the fins herein, but inversed, such that a nanoribbon is similar to a sideways laying fin (e.g., with a width to height ratio of at least 1.5, 2, 2.5, 3, 4, or 5).

Figure 8D:
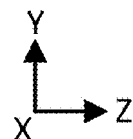
Figure 8D:
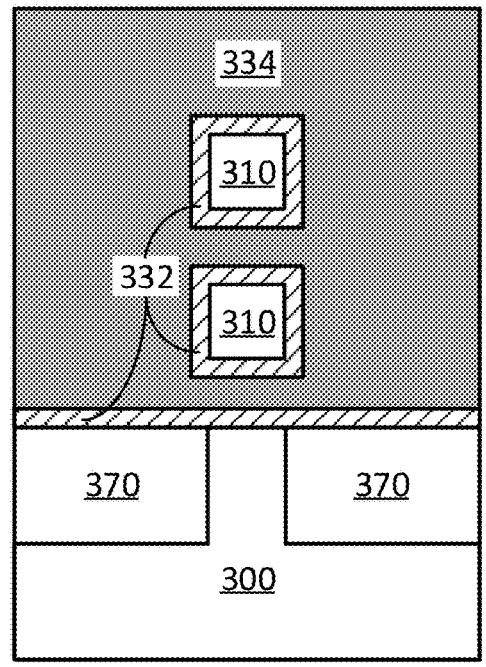

In some embodiments employing a gate-all-around or GAA configuration, the nanowire/nanoribbon-shaped body (e.g., 310 in FIGS. 6 and 8B) has a height (in the Y-axis direction) in the range of 2-100 nm (or in a subrange of 2-10, 2-25, 2-40, 2-50, 2-75, 4-10, 4-25, 4-40, 4-50, 4-75, 4-100, 10-25, 10-40, 10-50, 10-75, 10-100, 25-40, 25-50, 25-75, 25-100, or 50-100 nm) or greater, or any other suitable range as can be understood based on this disclosure. In some embodiments, the nanowire/nanoribbon-shaped body has a height of at least 2, 5, 8, 10, 15, 20, 25, or 50 nm, and/or a height of at most 100, 75, 50, 40, 30, 25, 20, 15, 12, or 10 nm, for example. Although only one body (or nanowire or nanoribbon) is shown in the example structures of FIGS. 6 and 8B, any number of bodies (or nanowires or nanoribbons) can be employed in a gate-all-around configuration, such as 2-10 or more, in accordance with some embodiments. For instance, FIG. 8D also shows a cross-sectional view through the channel region and gate structure, and includes two bodies of channel material 310 (which may be considered nanowires or nanoribbons). Also note that the bodies of channel material 310 in the structure of FIG. 8D are square-shaped as opposed to circular, as shown in FIG. 8B. Thus, nanowires or nanoribbons could employ various different shapes, such as a circle, oval, ellipse, square, rectangle, sheet, fin, or any other shape as can be understood based on this disclosure. Further note that the structure of FIG. 8D does not include dielectric wall structures 320, as shown.

FIGS. 7A-7D illustrate example cross-sectional integrated circuit views through a S/D region of the structure of FIG. 6 to illustrate forming the S/D contact structure around that S/D region when employing dielectric wall structures, in accordance with some embodiments. In more detail, the structures are views along dashed line 7D-7D in FIG. 6, with the structure of FIG. 7D corresponding to the actual structure of FIG. 6, as can be understood. Recall that the processing optionally includes forming 204 dielectric wall structures, as previously described. Such dielectric wall structures 320 are shown in FIGS. 7A-7D, and they include one or more dielectrics, in accordance with some embodiments. In some such embodiments, the dielectric material included in dielectric wall structures 320 includes any suitable oxide (e.g., silicon dioxide), nitride (e.g., silicon nitride), high-k dielectric, low-k dielectric, and/or any other suitable electrically insulating material as can be understood based on this disclosure. In some embodiments, dielectric wall structures 320 include silicon, oxygen, nitrogen, and/or carbon. For instance, in some embodiments, dielectric wall structures 320 includes silicon dioxide, silicon monoxide, silicon nitride, silicon oxynitride, or carbon-doped silicon dioxide (or other carbon-doped oxides). In some embodiments, dielectric wall structures 320 have a top portion (farthest from substrate 300) that includes hi-k dielectric material (e.g., to help provide relatively robust etch selectivity when removing sacrificial layer 340) and a bottom portion (nearest to substrate 300) that includes low-k dielectric material (e.g., to help reduce capacitance). Note that in some embodiments, the dielectric wall structures 320 extend from adjacent to the source region (e.g., one of the S/D regions 360) to adjacent to the drain region (e.g., the other of the S/D regions), while in other embodiments, the dielectric wall structures 320 may only be formed adjacent to the source and drain regions (such that they do not extend under the gate line, for example). The other features of the structures are apparent in light of this disclosure.

As shown in structures of FIGS. 7A-7D, dielectric wall structures 320 allow the sacrificial layer to be removed from under the S/D regions 360 without going through a given S/D region 360 (as opposed to the previous description of the techniques), in accordance with some embodiments. For instance, FIG. 7A illustrates the sacrificial layer 340 formed at the bottom of the S/D trench 350, similar to the processing described herein to form the structure of FIG. 3D. Thus, the structure of FIG. 3D also applies to the structure of FIG. 7A, where FIG. 7A would be the view indicated by the dashed line 4A-4A, for example. Note that compared to the structure of FIG. 4A, the sacrificial layer 340 also forms on the sidewalls of the dielectric wall structures 320 in the structure of FIG. 7A, which acts as a space-holder to allow later removal via selective etch and access to the bottom portion of the sacrificial layer 340. FIG. 7B illustrates the S/D region 360 after it is formed, similar to the processing described herein to form the structure of FIG. 3E. Thus, the structure of FIG. 3E also applies to the structure of FIG. 7B, where 7B would be the view indicated by the dashed line 4B-4B, for example. Note that the sacrificial layer 340 encapsulates the epitaxial semiconductor material of the S/D region 360 as it grows and provides isolation between the sidewall of the S/D material 360 and the dielectric wall structures 320, as well as between the underside of the S/D material 360 and the substrate 300, as shown.

FIG. 7C illustrates the sacrificial layer 340 having been selectively etched and removed during S/D contact processing (such as during process 216 described herein). Recall that although the sacrificial layer 340 is shown as having been completely removed in FIG. 7C, in some cases a portion of the sacrificial layer 340 is not removed and remains in the final structure. Note that the minimum space (indicated as 392 in FIG. 7C) between a side of the S/D region 360 and the adjacent dielectric wall structure 320 may be at least 2, 3, 4, or 5 nm, in accordance with some embodiments. Such minimal clearance (e.g., at least 2 nm or at least 5 nm) may be required to ensure access of the sacrificial layer 340 under the S/D region 360 during the selective etch processing used to remove that sacrificial layer 340, for example. However, too much of a clearance reduces the size of the S/D region 360, which may be undesired. After the sacrificial layer 340 is at least partially removed from below the S/D region 360, FIG. 7D illustrates the S/D contact structures 380 having been deposited to form the metal features all-around the S/D material 360, including the underside of the S/D region 360 and along the sidewalls of the S/D region 360 between the dielectric wall structures 320 (such as during process 216 described herein). Note that the interface 395 between S/D contact 380 and S/D region 360 of FIG. 7D is increased relative to the interface 195 of FIG. 1. Recall, the structures described herein and enabled through sacrificial S/D layer processing have significantly larger contact area than typical state-of-the-art top-interface contact devices, as can be understood based on this disclosure. Such relatively increased S/D contact area reduces contact resistance and improves device performance. Numerous variations and configurations will be apparent in light of this disclosure.

Example System

Figure 9:
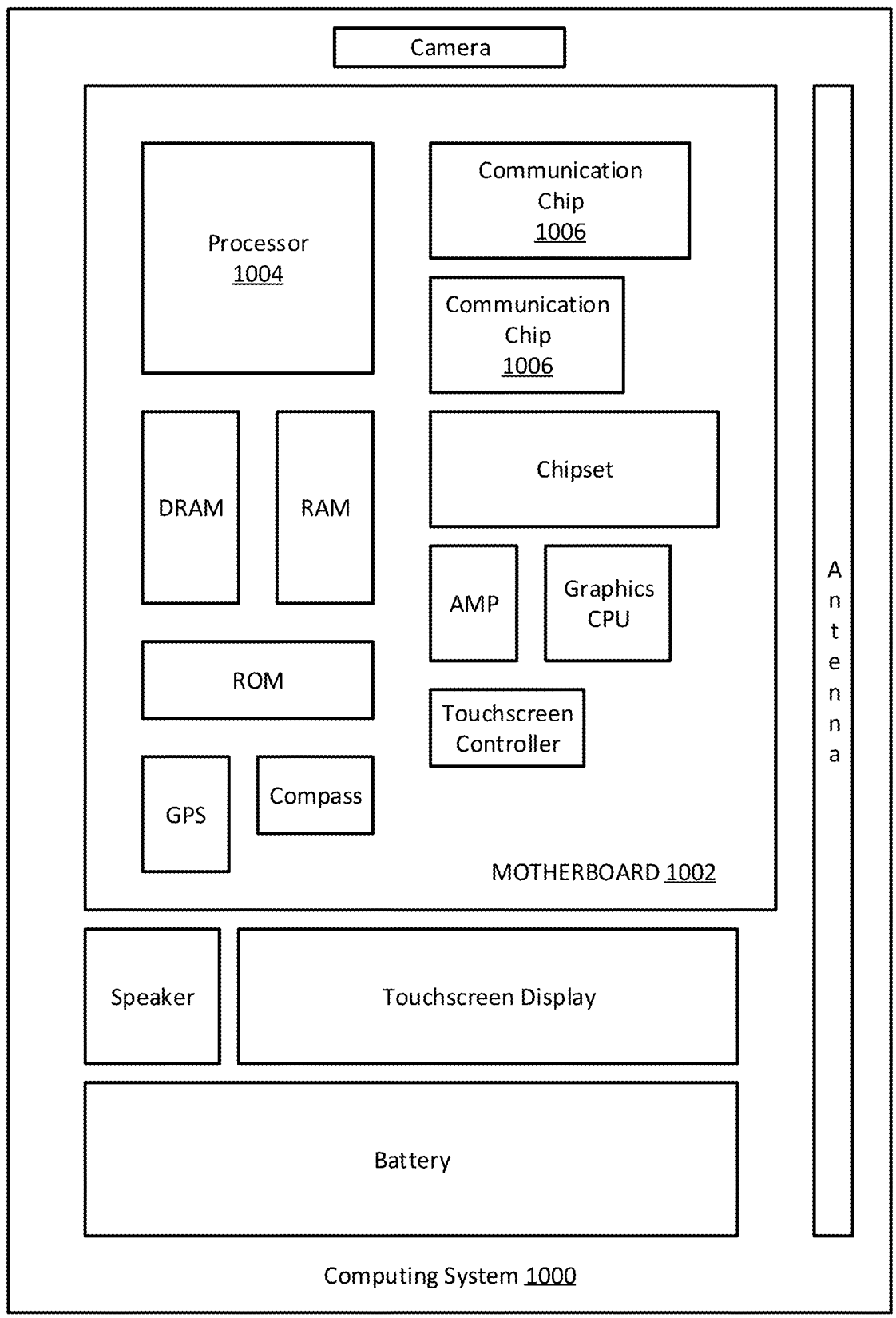
FIG. 9 illustrates a computing system implemented with integrated circuit structures including at least one transistor having increased source/drain contact area as disclosed herein, in accordance with some embodiments.

FIG. 9 illustrates a computing system 1000 implemented with integrated circuit structures including at least one transistor having increased S/D contact area as disclosed herein, in accordance with some embodiments. For example, the integrated circuit structures disclosed herein including at least one transistor having increased S/D contact area can be included in one or more portions of computing system 1000. As can be seen, the computing system 1000 houses a motherboard 1002. The motherboard 1002 can include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 can include one or more other components that may or may not be physically and electrically coupled to the motherboard 1002. These other components can include, but are not limited to, volatile memory (e.g., DRAM or other types of RAM), non-volatile memory (e.g., ROM, ReRAM/RRAM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 can include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 can implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 can include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also can include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability can be integrated directly into the processor 1004 (e.g., where functionality of any chips 1006 is integrated into processor 1004, rather than having separate communication chips). Further note that processor 1004 can be a chip set having such wireless capability. In short, any number of processor 1004 and/or communication chips 1006 can be used. Likewise, any one chip or chip set can have multiple functions integrated therein.

In various implementations, the computing system 1000 can be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit including at least one transistor. The integrated circuit includes a body (or channel region), a gate electrode and a gate dielectric (or, collectively, a gate structure), a source (or first) region and a drain (or second) region, a first (or source) contact structure, and a second (or drain) contact structure. The body includes semiconductor material. The gate electrode is at least above the body, the gate electrode including one or more metals. The gate dielectric is between the gate electrode and the body, the gate dielectric including one or more dielectrics. The body is between the source and drain regions, the source and drain regions including semiconductor material. The first contact structure includes one or more metals. The second contact structure includes one or more metals. Note that the semiconductor material of the body may be the same as the semiconductor material of the source and drain regions (not counting doping) according to some embodiments, while in other embodiments the semiconductor material of the body is compositionally different from the semiconductor material of the source and drain regions (not counting doping).

Example 2 includes the subject matter of Example 1, wherein the first contact structure is at least above and below the source region (such that the source region is between two portions of the first contact structure).

Example 3 includes the subject matter of Example 1 or 2, wherein the second contact structure is at least above and below the drain region (such that the drain region is between two portions of the second contact structure).

Example 4 includes the subject matter of any of Examples 1-3, wherein the first contact structure wraps around (or surrounds) the source region.

Example 5 includes the subject matter of any of Examples 1-4, wherein the second contact structure wraps around (or surrounds) the drain region.

Example 6 includes the subject matter of any of Examples 1-5, wherein the first contact structure is between two portions of the source region.

Example 7 includes the subject matter of any of Examples 1-6, wherein the second contact structure is between two portions of the drain region.

Example 8 includes the subject matter of any of Examples 1-7, wherein the first contact structure is adjacent to at least three or four sides of the source region.

Example 9 includes the subject matter of any of Examples 1-8, wherein the second contact structure is adjacent to at least three or four sides of the drain region.

Example 10 includes the subject matter of any of Examples 1-9, further comprising a substrate.

Example 11 includes the subject matter of Example 10, wherein a portion of the first contact structure is between the substrate and the source region.

Example 12 includes the subject matter of Example 10 or 11, wherein a portion of the second contact structure is between the substrate and the drain region.

Example 13 includes the subject matter of any of Examples 10-12, further comprising a layer between the first contact structure and the substrate, the layer including compositionally different material relative to the source region.

Example 14 includes the subject matter of any of Examples 10-13, further comprising a layer between the second contact structure and the substrate, the layer including compositionally different material relative to the drain region. Note that the layer in Examples 13 and 14 may be the same layer.

Example 15 includes the subject matter of Example 13 or 14, wherein the layer of Example 13 and/or 14 includes one or more dielectrics.

Example 16 includes the subject matter of Example 13 or 14, wherein the layer of Example 13 and/or 14 includes semiconductor material that is compositionally different from the semiconductor material included in the source and/or drain regions, respectively.

Example 17 includes the subject matter of any of Examples 1-16, further comprising a first wall structure and a second wall structure, the source region between the first and second wall structures, the first and second wall structures including one or more dielectrics.

Example 18 includes the subject matter of any of Examples 1-17, further comprising a first wall structure and a second wall structure, the drain region between the first and second wall structures, the first and second wall structures including one or more dielectrics. Note that the first and second wall structures in Examples 17 and 18 may be the same first and second wall structures that extend from the source region to the drain region.

Example 19 includes the subject matter of any of Examples 1-18, wherein the one or more metals included in the first and second contact structures include one or more transition metals.

Example 20 includes the subject matter of Example 19, wherein the one or more transition metals include one or more of tungsten, titanium, tantalum, copper, cobalt, gold, nickel, or ruthenium.

Example 21 includes the subject matter of any of Examples 1-20, wherein the body includes germanium.

Example 22 includes the subject matter of any of Examples 1-21, wherein the body includes group III-V semiconductor material.

Example 23 includes the subject matter of any of Examples 1-22, wherein the body is a fin, the fin between two portions of the gate electrode.

Example 24 includes the subject matter of Example 23, wherein the fin has a height of at least 20, 50, or 100 nanometers between the two portions of the gate electrode.

Example 25 includes the subject matter of any of Examples 1-22, wherein the gate electrode wraps around the body.

Example 26 includes the subject matter of Example 25, wherein the body is a nanowire or a nanoribbon.

Example 27 is a logic device including the subject matter of any of Examples 1-26.

Example 28 is a complementary metal-oxide-semiconductor (CMOS) circuit including the subject matter of any of Examples 1-27.

Example 29 is a computing system including the subject matter of any of Examples 1-28.

Example 30 is a method of forming the subject matter of any of Examples 1-29. The method includes at least providing the body (or channel region), forming the gate electrode, forming the gate dielectric, forming the source (or first) region and the drain (or second) region, forming the first (or source) contact structure, and forming the second (or drain) contact structure.

Example 31 includes the subject matter of Example 30, further including forming a sacrificial layer in the source and drain regions, and removing the sacrificial layer prior to forming the first and second contact structures, such that a cavity is formed below each of the first and second contact structures to allow the first and second contact structures to be respectively formed below the source and drain regions.

Example 32 includes the subject matter of Example 30 or 31, further comprising etching an opening in the source and drain regions prior to forming the first and second contact structures.

Example 33 includes the subject matter of any of Examples 30-32, further comprising forming a first wall structure and a second wall structure, the first and second wall structures including one or more dielectrics, the source and drain regions between the first and second wall structures.

Example 34 includes the subject matter of any of Examples 30-33, wherein forming the source and drain regions includes epitaxially growing semiconductor material included in the regions from the body.

Example 35 includes the subject matter of any of Examples 30-34, wherein the gate dielectric and gate electrode are formed after forming the source and drain regions.

Example 36 is an integrated circuit including at least one transistor, the integrated circuit comprising: a substrate; a body above the substrate, the body including semiconductor material; a gate electrode at least above the body, the gate electrode including one or more metals; a gate dielectric between the gate electrode and the body, the gate dielectric including one or more dielectrics; a source region and a drain region, the body between the source and drain regions, the source and drain regions including semiconductor material; a first contact structure that wraps around the source region, a portion of the first contact structure between the substrate and the source region, the first contact structure including one or more metals; and a second contact structure that wraps around the drain region, a portion of the second contact structure between the substrate and the drain region, the second contact structure including one or more metals.

Example 37 includes the subject matter of Example 36, wherein the body is a fin, a nanowire, or a nanoribbon.

Example 38 is a method of forming an integrated circuit including at least one transistor, the method comprising: providing a body including semiconductor material; forming a gate electrode at least above the body, the gate electrode including one or more metals; forming a gate dielectric between the gate electrode and the body, the gate dielectric including one or more dielectrics; forming a source region and a drain region, the body between the source and drain regions, the source and drain regions including semiconductor material; forming a first contact structure at least above and below the source region, the first contact structure including one or more metals; and forming a second contact structure at least above and below the drain region, the second contact structure including one or more metals.

Example 39 includes the subject matter of Example 38, the method further comprising: forming a sacrificial layer in the source and drain regions; and removing the sacrificial layer prior to forming the first and second contact structures, such that a cavity is formed below each of the first and second contact structures to allow the first and second contact structures to be respectively formed below the source and drain regions.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor, the integrated circuit comprising:
    a body including semiconductor material;
    a gate electrode at least above the body, the gate electrode including one or more metals;
    a gate dielectric between the gate electrode and the body, the gate dielectric including one or more dielectrics;
    a source region and a drain region, the body between the source and drain regions, the source and drain regions including semiconductor material, the source region having a side laterally spaced apart from the body, the side continuous from a top of the source region to a bottom of the source region, and the drain region having a side laterally spaced apart from the body, the side continuous from a top of the drain region to a bottom of the drain region;
    a first contact structure above and below and along an entirety of the side of the source region, the first contact structure including one or more metals; and
    a second contact structure above and below and along an entirety of the side of the drain region, the second contact structure including one or more metals.

2. The integrated circuit of claim 1, wherein the first contact structure wraps around at least a portion of the source region and the second contact structure wraps around at least a portion of the drain region.

3. The integrated circuit of claim 1, further comprising a substrate, wherein a portion of the first contact structure is between the substrate and the source region, and a portion of the second contact structure is between the substrate and the drain region.

4. The integrated circuit of claim 3, further comprising a layer between the first contact structure and the substrate, the layer also between the second contact structure and the substrate, the layer including compositionally different material relative to the source and drain regions.

5. The integrated circuit of claim 4, wherein the layer includes one or more dielectrics.

6. The integrated circuit of claim 1, wherein the first contact structure is between two portions of the source region, and the second contact structure is between two portions of the drain region.

7. The integrated circuit of claim 1, wherein the source region is between two structures, the two structures including one or more dielectrics, the drain region also between the two structures.

8. The integrated circuit of claim 1, wherein the one or more metals included in the first and second contact structures include one or more transition metals.

9. The integrated circuit of claim 8, wherein the one or more transition metals include one or more of tungsten, titanium, tantalum, copper, cobalt, gold, nickel, or ruthenium.

10. The integrated circuit of claim 1, wherein the body includes germanium or group III-V semiconductor material.

11. The integrated circuit of claim 1, wherein the body is a fin, the fin between two portions of the gate electrode.

12. The integrated circuit of claim 11, wherein the fin has a height of at least 20 nanometers between the two portions of the gate electrode.

13. The integrated circuit of claim 1, wherein the gate electrode wraps around the body.

14. The integrated circuit of claim 13, wherein the body is a nanowire or a nanoribbon.

15. A computing system comprising the integrated circuit of claim 1.

16. An integrated circuit including at least one transistor, the integrated circuit comprising:
 a substrate;
 a body above the substrate, the body including semiconductor material;
 a gate electrode at least above the body, the gate electrode including one or more metals;
 a gate dielectric between the gate electrode and the body, the gate dielectric including one or more dielectrics;
 a source region and a drain region, the body between the source and drain regions, the source and drain regions including semiconductor material, the source region having a side laterally spaced apart from the body, the side continuous from a top of the source region to a bottom of the source region, and the drain region having a side laterally spaced apart from the body, the side continuous from a top of the drain region to a bottom of the drain region;
 a first contact structure that wraps around the source region, the first contact structure along an entirety of the side of the source region, a portion of the first contact structure between the substrate and the source region, the first contact structure including one or more metals; and
 a second contact structure that wraps around the drain region, the second contact structure along an entirety of the side of the drain region, a portion of the second contact structure between the substrate and the drain region, the second contact structure including one or more metals.

17. The integrated circuit of claim 16, wherein the body is a fin, a nanowire, or a nanoribbon.

18. A method of forming an integrated circuit including at least one transistor, the method comprising:
 providing a body including semiconductor material;
 forming a gate electrode at least above the body, the gate electrode including one or more metals;
 forming a gate dielectric between the gate electrode and the body, the gate dielectric including one or more dielectrics;
 forming a source region and a drain region, the body between the source and drain regions, the source and drain regions including semiconductor material, the source region having a side laterally spaced apart from the body, the side continuous from a top of the source region to a bottom of the source region, and the drain region having a side laterally spaced apart from the body, the side continuous from a top of the drain region to a bottom of the drain region;
 forming a first contact structure above and below and along an entirety of the side of the source region, the first contact structure including one or more metals; and
 forming a second contact structure above and below and along an entirety of the side of the drain region, the second contact structure including one or more metals.

19. The method of claim 18, further comprising:
 forming a sacrificial layer in the source and drain regions; and
 removing the sacrificial layer prior to forming the first and second contact structures, such that a cavity is formed to allow the first and second contact structures to be respectively formed below the source and drain regions.

* * * * *